United States Patent
Kanai et al.

[11] Patent Number: 6,154,349
[45] Date of Patent: Nov. 28, 2000

[54] MAGNETORESISTIVE TRANSDUCER INCLUDING COFEZ SOFT MAGNETIC LAYER

[75] Inventors: Hitoshi Kanai; Junichi Kane; Ken'ichiro Yamada, all of Kanagawa, Japan

[73] Assignee: Fujitsu Limited, Kawasaki, Japan

[21] Appl. No.: 08/783,464

[22] Filed: Jan. 16, 1997

[30] Foreign Application Priority Data

Apr. 26, 1996 [JP] Japan ................................ 8-106932
Sep. 20, 1996 [JP] Japan ................................ 8-250708

[51] Int. Cl.$^7$ ............................................. G11B 5/39
[52] U.S. Cl. .............................. 360/324.12; 360/324.11
[58] Field of Search ................................. 360/113, 126; 338/32 R, 324.12, 324.11

[56] References Cited

U.S. PATENT DOCUMENTS

| | | | |
|---|---|---|---|
| 5,159,513 | 10/1992 | Dieny et al. | 360/113 |
| 5,206,590 | 4/1993 | Dieny et al. | 324/252 |
| 5,390,061 | 2/1995 | Nakatani et al. | 360/113 |
| 5,534,355 | 7/1996 | Okuno et al. | 360/113 |
| 5,549,978 | 8/1996 | Iwasaki et al. | 360/113 |
| 5,569,544 | 10/1996 | Daughton | 360/113 |
| 5,841,611 | 11/1998 | Sakakima et al. | 360/113 |
| 5,874,886 | 2/1999 | Araki et al. | 360/126 |

FOREIGN PATENT DOCUMENTS

| | | |
|---|---|---|
| 19528245A1 | 3/1996 | Germany . |
| 8203035 | 8/1996 | Japan . |

*Primary Examiner*—Craig A. Renner
*Attorney, Agent, or Firm*—Greer, Burns & Crain, Ltd.

[57] ABSTRACT

A magnetoresistive transducer includes a multilayer provided with a first soft magnetic layer, a conductive nonmagnetic layer, a second soft magnetic layer, and a biasing magnetic layer giving a magnetization of a predetermined direction to the second soft magnetic layer, in that order of superposition. The first soft magnetic layer is a multilayer superposed structure including a $(Co_yFe_{100-y})_{100-x}Z_x$ alloy layer where Z represents boron and x and y represent atomic fractions (at %), and an alloy layer containing at least Ni and Fe. The $(Co_yFe_{100-y})_{100-x}Z_x$ alloy layer of the first soft magnetic layer borders on the nonmagnetic layer and has a face-centered cubic lattice structure with a d spacing smaller than a d spacing of a $Co_yFe_{100-y}$ alloy. A pair of electrodes are formed on the multilayer for allowing a sense current to pass through the multilayer.

28 Claims, 23 Drawing Sheets

Sample (from bottom to top)
Ta(5)/NiFe(3.5)/ $Co_{90}Fe_{10}B(t)$ / Cu (3.2)/ $Co_{90}Fe_{10}B(t)$/
FeMn(10)/ Ta(10) * Numerals in parentheses indicate film thicknesses, nm.

Sample (from bottom to top)

(a) NiO(50)/NiFe(2)/Co$_{90}$Fe$_{10}$B(2)/Cu(3.2)/Co$_{90}$Fe$_{10}$B(4)/NiFe(3.5)/Ta(10)

(b) NiO(50)/Co$_{90}$Fe$_{10}$B(4)/Cu(3.2)/Co$_{90}$Fe$_{10}$B(4)/NiFe(3.5)/Ta(10)

(c) NiO(50)/NiFe(2)/Co$_{90}$Fe$_{10}$B(2)/Cu(3.2)/Co$_{90}$Fe$_{10}$B(4)/NiFe(3.5)/Ta(10)

(d) NiO(50)/Co$_{90}$Fe$_{10}$B(4)/Cu(3.2)/Co$_{90}$Fe$_{10}$B(4)/NiFe(3.5)/Ta(10)

*1) $Co_{90}Fe_{10}B$ content (atmic fraction)
   Sample(a),(b) ; 5 %
   Sample(c),(d) ;10 %

*2) Numerals in parentheses indicate film thicknesses, nm.

Sample (from bottom to top)
* Numerals in parentheses indicate film thicknesses, nm.

●— Ta(5)/NiFe(4.5)/Co$_{90}$Fe$_{10}$B(t)/Cu(3.2)/Co$_{90}$Fe$_{10}$B(3)/ NiFe(1)/FeMn(10)/Ta(10)

○— Ta(5)/NiFe(4.5)/Co$_{90}$Fe$_{10}$B(t)/Cu(3.2)/Co$_{90}$Fe$_{10}$B(3)/ FeMn(10)/Ta(10)

Sample (from bottom to top)

Ta(5)/ NiFe(3.5)/ Co$_{90}$Fe$_{10}$(4)/ Cu(3.2)/ Co$_{90}$Fe$_{10}$(4)/FeMn(10)/
Ta(10)
 * Numerals in parentheses indicate film thicknesses, nm.

MAGNETORESISTIVE TRANSDUCER INCLUDING COFEZ SOFT MAGNETIC LAYER

BACKGROUND OF THE INVENTION

1. Field of the Invention

This invention relates to a magnetoresistive transducer, a method for the formation of a magnetic film, and a magnetic recording/reproducing drive, and more particularly to a magneto-resistive transducer for converting a change in the signal magnetic field from a magnetic recording media into a change in the electric resistivity as by the spin valve magnetoresistivity, a method for the formation of a magnetic film, and a magnetic recording drive.

2. Description of the Prior Art

In recent years, the thin film magnetic head which can comply with the trend of magnetic disc devices toward exaltation of recording density and miniaturization has been attracting attention and is demanded to offer improved performance. In the field of the magnetoresistive type reproducing heads (MR head), the MR elements of high performance are now under development. The elements provided with a giant magnetoresistive film capable of yielding a high output without relying on the speed of movement of the magnetic recording media have been of arresting interest. Among other elements of this class, particularly the spin valve magnetoresistive film is renowned because it can be relatively easily formed. Moreover, this film has been attracting special attention because the MR elements provided with the film have a large change in electric resistance in a low magnetic field as compared with the other MR elements.

The magnetoresistive transducers that utilize the spin valve magnetoresistance have been disclosed in U.S. Pat. No. 5,206,590 and JP-A-06-60,336, for example.

FIG. 1A is a perspective view illustrating a spin valve magnetoresistive transducer of the conventional principle and FIG. 1B is a cross section taken through FIG. 1A along the line I—I.

As illustrated in FIG. 1A and FIG. 1B, a ground layer 2 formed of tantalum (Ta), a free magnetic layer 3 consisting of an NiFe film 3b and a $Co_{90}Fe_{10}$ film 3a, a nonmagnetic metal layer 4 formed of a Cu film, a $Co_{90}Fe_{10}$ (pinning magnetic layer) 5, an antiferromagnetic layer 6, and a cap layer 7 are sequentially superposed on an altic substrate 1.

The component layers from the ground layer 2 through the cap layer 7 are patterned in an oblong shape. On the cap layer 7 constituting the uppermost layer, outlet electrodes 8a and 8b are formed in the opposite terminal parts across a sense area (SA). The change in magnetoresistance in the sense area (SA) is measured as the change in voltage.

The pinning magnetic layer 5, by exchange coupling with the antiferromagnetic layer 6, generates an exchange coupling magnetic field in the direction of the X axis in a X,Y,Z coordinate system. The magnetization of the pinning magnetic layer 5 is consequently fixed in the direction of the X axis and this magnetization is not changed due to a signal magnetic field. The free magnetic layer 3 is magnetized in the direction of the Y axis in the absence of a signal magnetic field and this magnetization is easily changed by a signal magnetic field. The magnetoresistance is changed in proportion to the cosine of the angle, θ, to be formed by the direction of the magnetization of the free magnetic layer 3 and the direction of the magnetization of the pinning magnetic layer 5 (cos θ).

The free magnetic layer 3 is a two-layer film consisting of an NiFe film 3b and a $Co_{90}Fe_{10}$ film 3a. It, therefore, yields more than twice as high magnetoresistive output as when the free magnetic layer 3 is formed solely of the NiFe film 3a.

When a magnetic head is formed with the MR element described above, however, a resist film as an interlayer insulating film must be hardened by a heat treatment to be performed at a temperature in the range of 230 to 300°. In this case, the rate of change of the electric resistivity, Δρ, is lowered by this heat treatment as illustrated in FIG. 8. It is inferred that this decline of the rate of change of the electric resistivity, Δρ, is induced particularly by the inclusion of Cu into the NiFe film 3a of the free magnetic layer 3.

This phenomenon has the problem of incurring a decrease in the reproduced output of the magnetic head.

SUMMARY OF THE INVENTION

This invention has for an object thereof the provision of a magnetoresistive transducer of enhanced resistance to heat, a method for the formation of a magnetic film, and a magnetic recording/reproducing drive.

The present inventors have pursued a study in search of the cause for the decline of the rate of change, Δρ, in the electric resistivity of the conventional spin valve element film illustrated in FIG. 1A and FIG. 1B in consequence of a heat treatment.

A sample obtained by superposing a Ta film, 5 nm in thickness, a $Co_{90}Fe_{10}$ film, 20 nm in thickness, and a Ta film, 5 nm in thickness, on an altic substrate was subjected to a heat treatment.

FIG. 10 shows the results of an investigation performed concerning the relation between the temperature of the heat treatment and the d spacing of the $Co_{90}Fe_{10}$ alloy film. The results indicate that the d spacing decreased in accordance as the temperature of the heat treatment increased.

FIG. 9 shows the results of a study on the structure of the $Co_{90}Fe_{10}$ alloy film by the X-ray diffraction. This diagram indicates that the peak of the face-centered cubic lattice structure (fcc) of the film deviated from the position assumed immediately after the formation of the film toward increasing 2θ in proportion as the temperature of the heat treatment rose and shifted, though not perfectly, toward a hexagonal close-packed lattice structure (hcp).

The experiment described above supports a conclusion that any magnetic alloy that has a smaller d spacing than the d spacing of the $Co_{90}Fe_{10}$ alloy from immediately after the formation of the film forward exhibits an improved barrier property against Cu and enjoys an enhanced heat resistance. It has been further found that the magnetic alloy must possess a face-centered cubic lattice structure (fcc) besides fulfilling the other conditions.

Thus, a ground layer (Ta or the like), a soft magnetic layer (NiFe film or the like), and a nonmagnetic layer (Cu film or the like) are superposed on an altic substrate and a $(Co_{90}Fe_{10})_{100-x}Z_x$ alloy film is further superposed thereon in an effort to attain an fcc lattice structure. It is particularly advantageous to adopt this sequence of superposition of layers for the $(Co_{90}Fe_{10})_{100-x}Z_x$ alloy film on the side of the free magnetic layer which has the magnetization thereof varied by a signal magnetic field. It has been also found that the $(Co_{90}Fe_{10})_{100-x}Z_x$ alloy (wherein Z stands for an atom of boron or carbon) well qualifies as the magnetic alloy that answers the description just given under the condition.

FIG. 7 represents a pattern of the change in the d spacing of the $(Co_{90}Fe_{10})_{100-x}B_x$ alloy relative to the boron content (atomic fraction) and FIG. 6 shows the results of a study performed on the pattern of the change of the structure relative to the boron content with the aid of the X-ray diffraction. The results indicate that the addition of boron reduces the d spacing and ensures retention of the fcc lattice structure.

This alloy is improved in heat resistance by a heat treatment as shown in FIG. 3A. Meanwhile, the heat resistance of the $(Co_{90}Fe_{10})_{100-x}B_x$ alloy film depends on the thickness (t) of the film. The heat resistance is not appreciably different from that of the conventional film when the thickness (t) decreases to 2 nm. It is inferred that this film no longer exhibits a satisfactory barrier property against Cu when it has an unduly small thickness. When the $(Co_{90}Fe_{100})_{100-x}B_x$ alloy film is used at all, therefore, it requires to have a thickness of not less than 2 nm, preferably not less than 3 nm, at a working temperature of not more than 300° C.

For the sake of further improving the heat resistance, it is appropriate to have a cobalt-iron type alloy layer not only on the bordering side, which borders on the nonmagnetic layer 14, of the free magnetic layer 13 but also on the bordering side of the pinning magnetic layer 15. The case of forming the pinning magnetic layer itself with a cobalt-iron type alloy layer, or the case of forming the pinning magnetic layer 15 with a two-layer film consisting of a cobalt-iron type alloy layer and an NiFe film is conceivable.

Incidentally, it has been experimentally confirmed that when a cobalt-iron type alloy layer is made to adjoin the nonmagnetic metal layer 14, a difference in the structure of superposition brought about a change in heat resistance as shown in FIG. 5A and FIG. 5B. This fact deserves a due consideration. Specifically, when the thickness of the cobalt-iron type alloy layer of the pinning magnetic layer 15 decreased to the neighborhood of 3 nm, for example, the heat resistance was high when the pinning magnetic layer 15 was formed of a two-layer film consisting of a cobalt-iron type alloy layer and an NiFe film as compared with the pinning magnetic film 15 formed solely of a cobalt-iron type alloy layer.

The application of this alloy layer for a spin valve film or an artificial lattice film allows production of a magnetoresistive transducer or a magnetic recording/reproducing drive which enjoys high heat resistance.

Besides, it has been disclosed in JP-A-08-203035 that the CoFeB film is used as the magnetic layer of the spin valve layer. The present invention is, however, different from the above disclosure in the two points that ① the disclosed CoFeB film is made of the amorphous film which is not crystallized, and ② the boron atomic fraction of the CoFeB film in the disclosure is in the range of 10 to 25%.

DESCRIPTION OF THE PREFERRED EMBODIMENT

Now, the embodiments of this invention will be described below with reference to the accompanying drawings.

(1) Study on structure and heat resistance of $(Co_{90}Fe_{10})_{100-x}B_x$ alloy film according to the embodiment of this invention The results of a study performed on the structure and the heat resistance of a $(Co_{90}Fe_{10})_{100-x}B_x$ alloy film (wherein x stands for an atomic fraction) having a prescribed boron (B) content will be described below. A comparative sample was also studied concerning the items mentioned above. The results are shown below.

(Study on Heat Resistance)

Figure 2A:
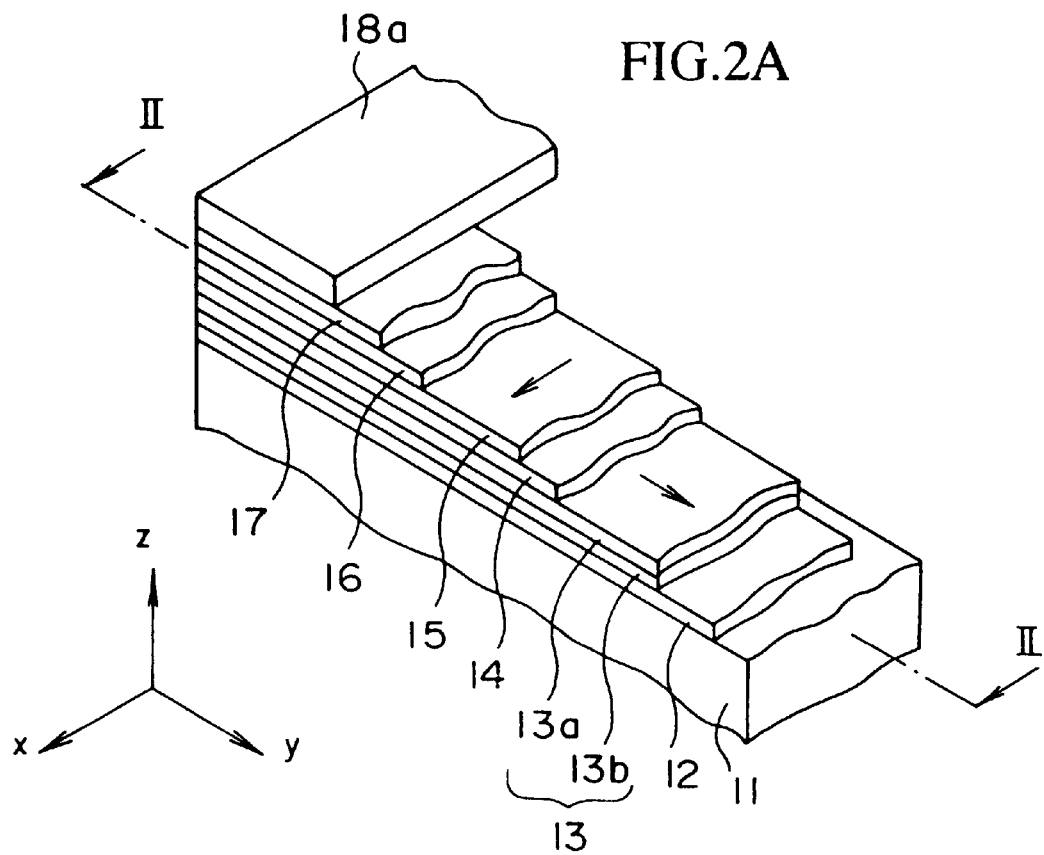
FIG. 2A is a perspective view illustrating a magnetoresistive transducer in X, Y and Z directions according to the first embodiment of this invention.
Figure 2B:
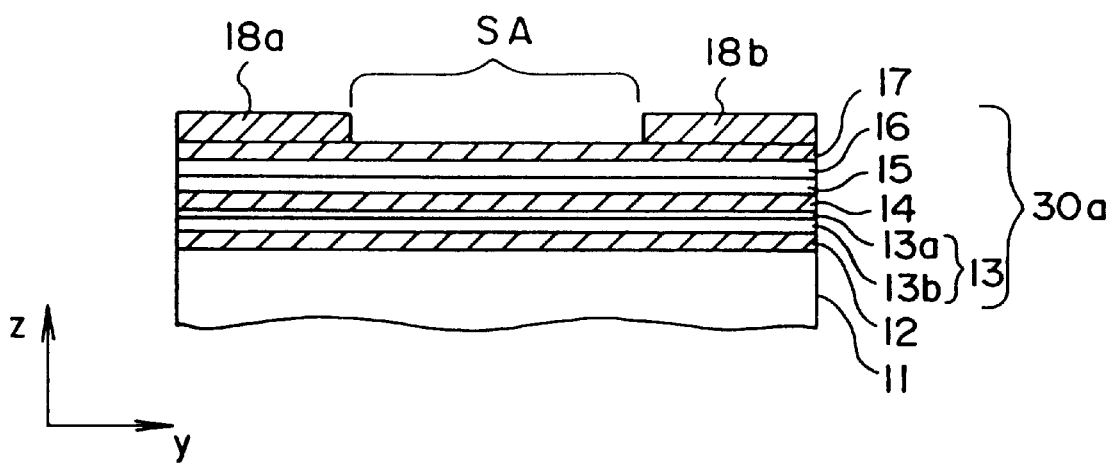
FIG. 2B is a cross section taken through FIG. 2A along the line II—II.

(A) A sample of the structure of superposition shown in FIG. 2A and FIG. 2B was used for the study on heat resistance. The sample had an ground layer 12 formed of a Ta film, 5 nm in thickness, a free magnetic layer 13 consisting of an NiFe film 13b, 3.5 nm in thickness, and a $(Co_{90}Fe_{10})_{100-x}B_x$ alloy film 13a, t in thickness, a nonmagnetic metal layer 14 formed of a Cu film, 3.2 nm in thickness, a pinning magnetic layer 15, an antiferromagnetic layer 16 formed of an FeMn film, 10 nm in thickness, and a cap layer 17 formed of a Ta film, 10 nm in thickness superposed sequentially in the order mentioned on an altic substrate 11. In the cobalt-iron type magnetic material represented by the formula, $(Co_{90}Fe_{10})_{100-x}B_x$, the atomic fraction of cobalt (Co) is set at 90 at % and the atomic fraction of iron (Fe) at 10 at %. In this case, the cobalt-iron type magnetic material represented by the formula, $(Co_{90}Fe_{10})_{100-x}B_x$, acquires the best soft magnetic characteristic. These atomic fractions are inevitably fluctuated in the actual formation of the film. For the purpose of attaining a satisfactorily high rate of change, $\Delta\rho$, however, it is proper that the atomic fraction of Co falls in the range of 85 to 95 at % and the atomic fraction of Fe in the range of 15 to 5 at %.

In the construction mentioned above, a $(Co_{90}Fe_{10})_{100-x}B_x$ film, 4 nm in thickness, was used for the pinning magnetic layer 15. The $(Co_{90}Fe_{10})_{100-x}B_x$ films for the free magnetic layer 13 and the pinning magnetic layer 15 were formed with two atomic fractions (2 at % and 9 at %) of boron (B).

Figure 1A:
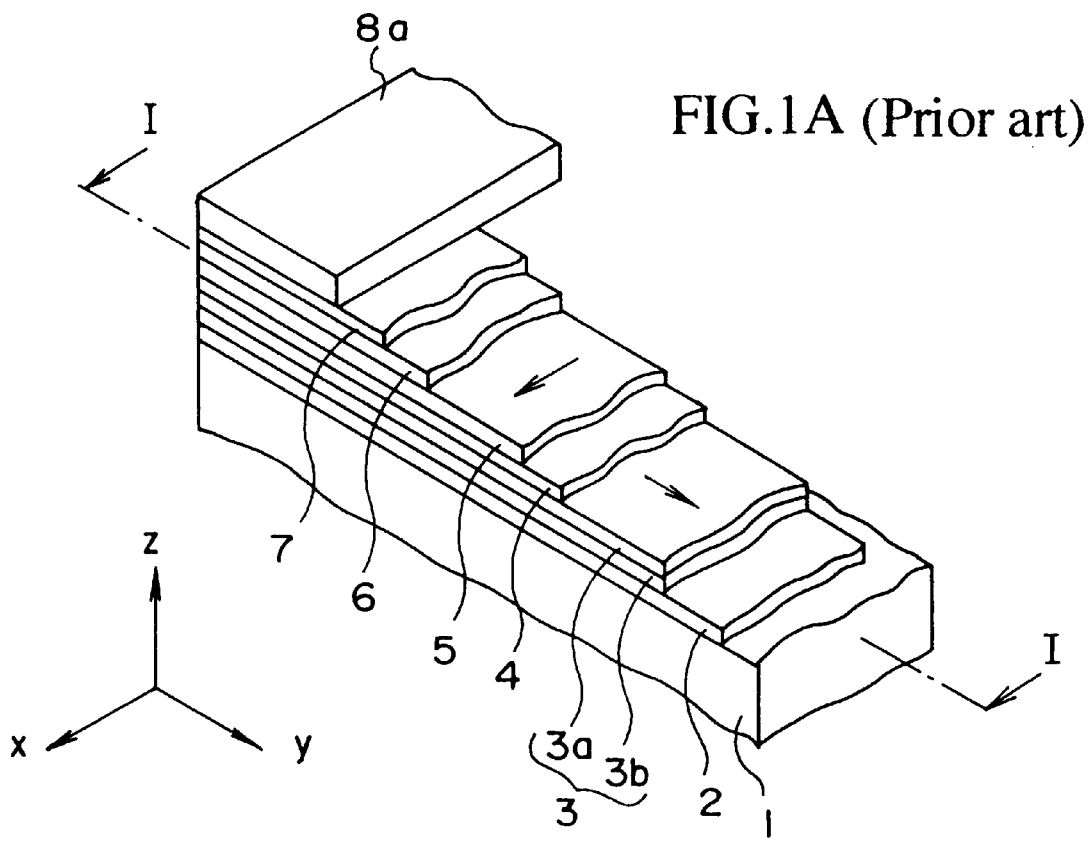
FIG. 1A is a perspective view illustrating a magnetoresistive transducer of the conventional principle.
Figure 1B:
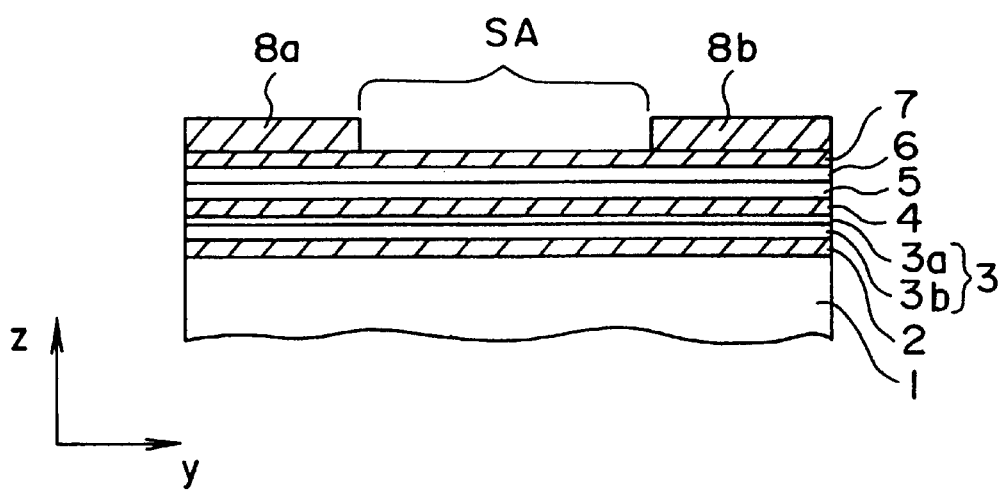
FIG. 1B is a cross section taken through FIG. 1B along the line I—I.

As a comparative sample, a magnetic film having the structure of superposition illustrated in FIG. 1A and FIG. 1B using the free magnetic layer 13 formed of a two-layer film consisting of an NiFe film and a $Co_{90}Fe_{10}$ film and the pinning magnetic layer 15 formed of a $Co_{90}Fe_{10}$ film was used. The other component layers of the structure and their thicknesses are identical with those of the structure shown in FIG. 2A and FIG. 2B.

Figure 3A:
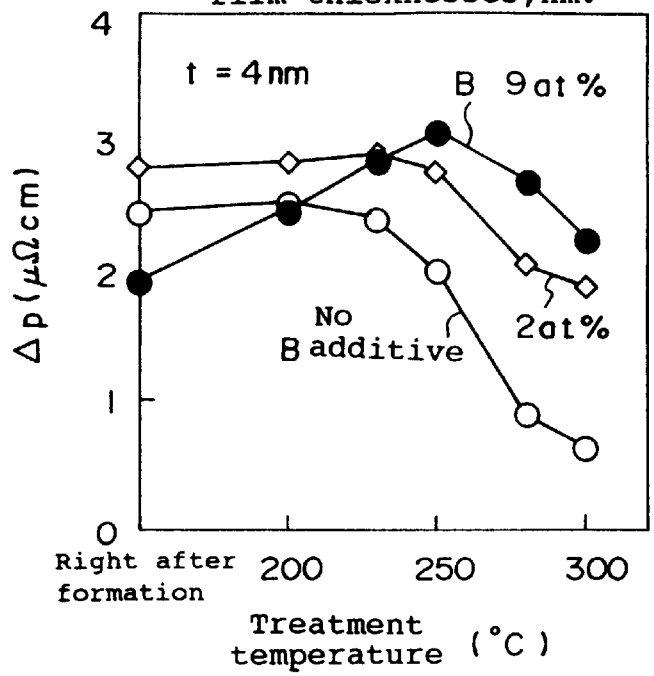
FIG. 3A is a characteristic diagram illustrating the pattern of the change in electric resistivity of the magnetoresistive transducer according to one embodiment of this invention relative to the temperature of heat treatment.
Figure 4:
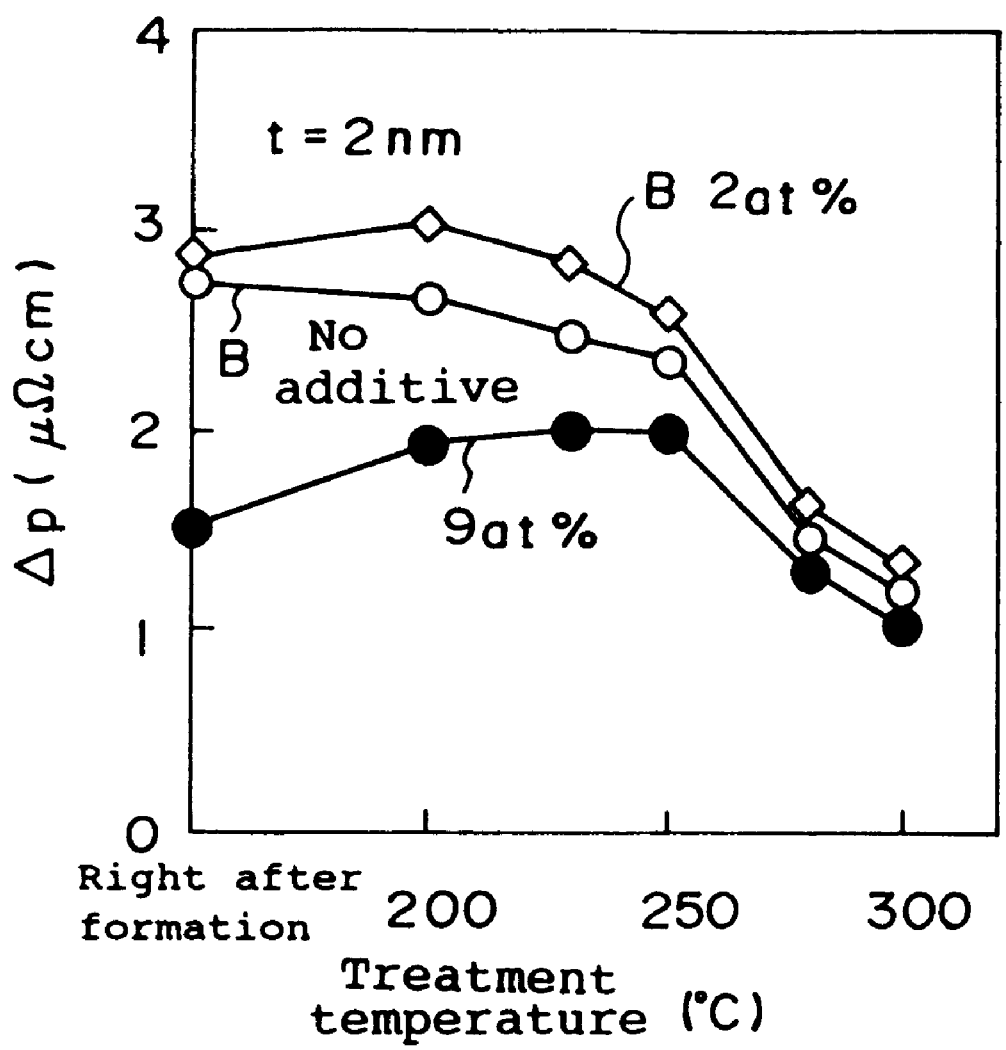
FIG. 4 is a characteristic diagram showing the pattern of the change in electric resistivity of the magnetoresistive transducer having the thickness of the $(Co_{90}Fe_{10})_{100-x}B_x$ alloy film decreased relative to the temperature of the heat treatment.

FIG. 3A is a characteristic diagram illustrating the pattern of the change in the rate of change, $\Delta\rho$, of electric resistivity relative to the temperature of heat treatment. FIG. 4 is a characteristic diagram illustrating the pattern of the variation in the rate of change, $\Delta\rho$, of electric resistivity of the $(Co_{90}Fe_{10})_{100-x}B_x$ film having the thickness, t, decreased to 1 nm relative to the temperature of heat treatment. In both diagrams, the vertical axis represents the rate of change, $\Delta\rho$ ($\mu\Omega cm$), of electric resistivity expressed on the linear scale and the horizontal axis the temperature (° C.) of heat treatment expressed on the linear scale. The vertical axis represents the rate of change, $\Delta\rho$ ($\mu\Omega cm$), of electric resistivity expressed on the linear scale and the horizontal axis the number (times) of heat treatments expressed on the linear scale.

The heat treatment was performed at either of the prescribed temperatures in a vacuum under application of a magnetic field of 2500 Oe for three hours.

Figure 8:
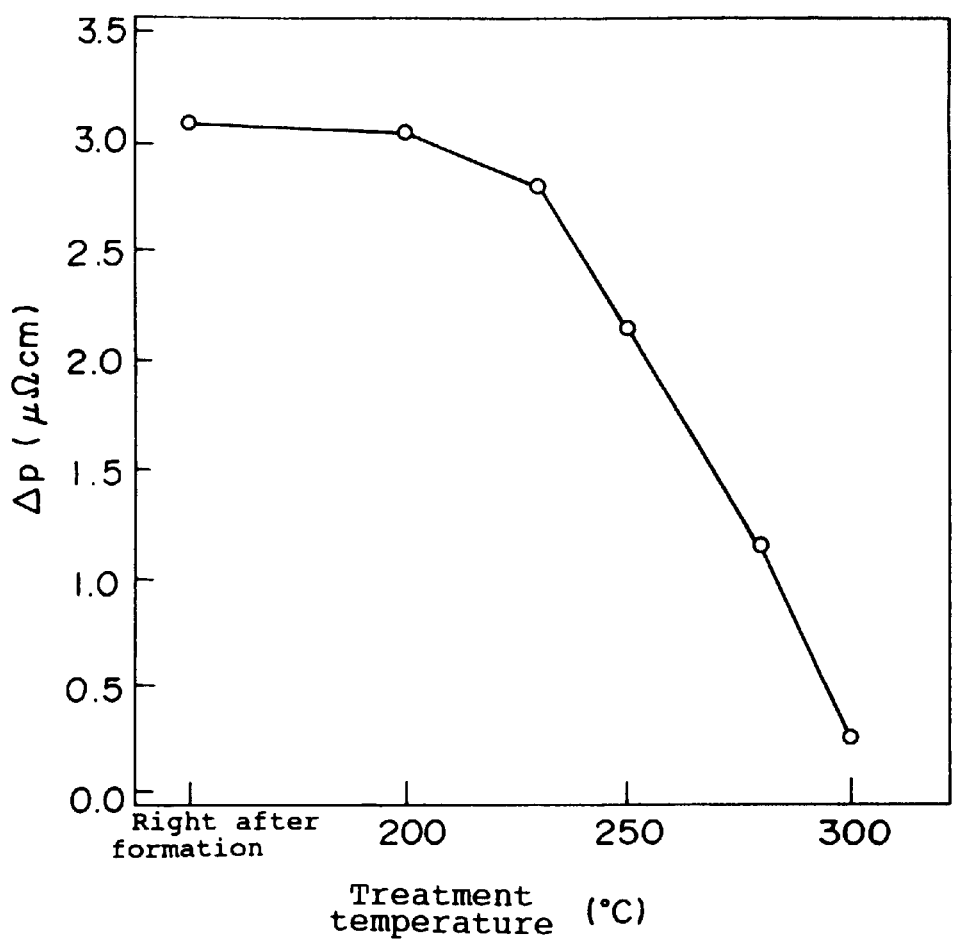
FIG. 8 is a characteristic diagram showing the pattern of the change in electric resistivity of the magnetoresistive transducer according to a comparative example relative to the temperature of the heat treatment.
Figure 9:
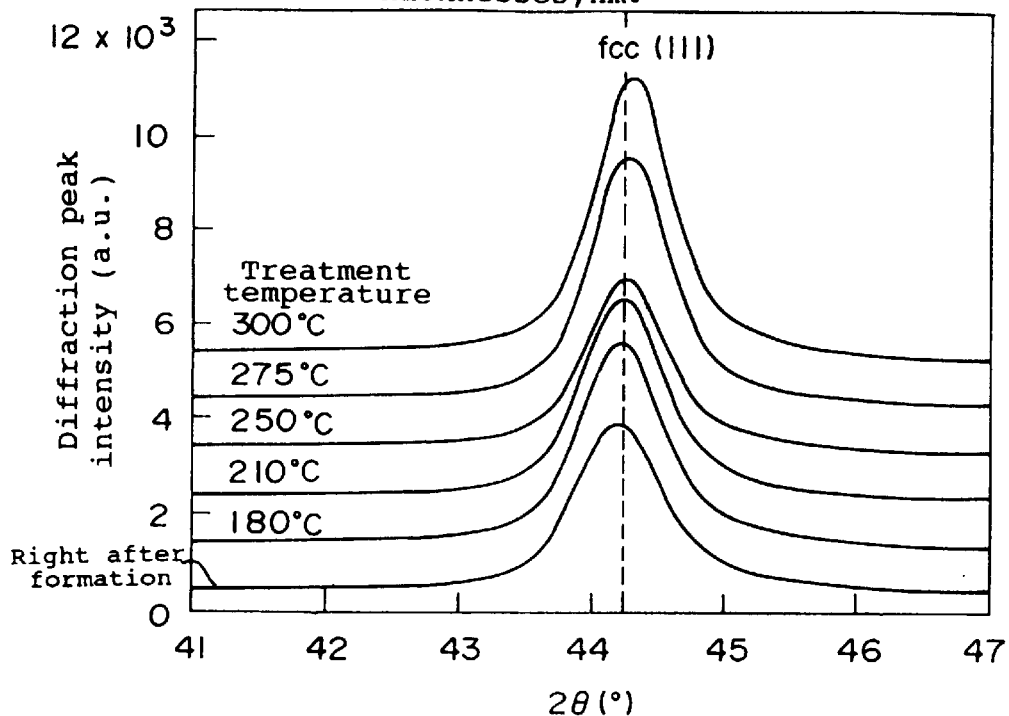
FIG. 9 is a diagram showing the diffraction peak intensity of the angle of incidence of the X ray on the $(Co_{90}Fe_{10})_{100-x}B_x$ alloy film used in the magnetoresistive transducer according to a comparative example.
Figure 10:
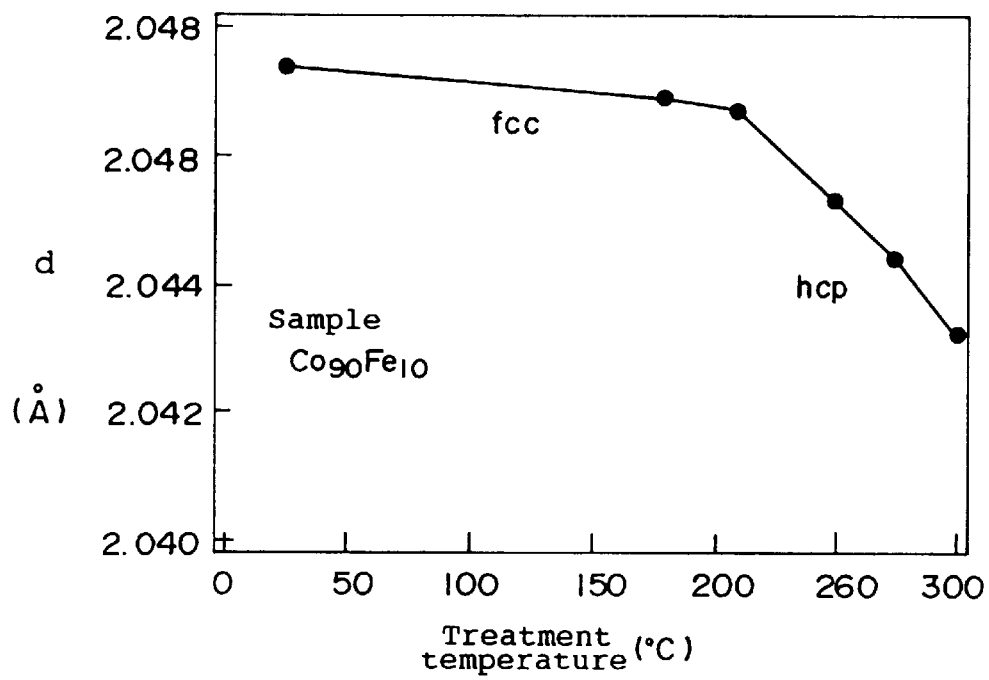
FIG. 10 is a diagram showing the pattern of the change in d spacing of the $(Co_{90}Fe_{10})_{100-x}B_x$ alloy film used in the magnetoresistive transducer according to the comparative example relative to the temperature of the heat treatment.

From the results of the study, it is noted that when the thickness, t, of the $(Co_{90}Fe_{10})_{100-x}B_x$ film was 4 nm, the $Co_{90}Fe_{10}$ film of this invention containing B showed a small variation in the rate of change, $\Delta\rho$, in electric resistivity as shown in FIG. 3A as compared with that of the $Co_{90}Fe_{10}$ film containing no B as shown in FIG. 8. The film containing 2% of B showed no decline in the rate of change, $\Delta\rho$, in electric resistivity at temperatures up to 250° C. The film containing 9% of B showed an increase in the rate of change, $\Delta\rho$, in electric resistivity at temperatures up to 250° C. and showed no decrease of this value from that existing immediately after the formation of film at higher temperatures up to 300° C. When the heat treatment performed at a temperature of 230° C. for 3 hours was repeated up to three times, the rate of change, $\Delta\rho$, showed no change as noted from FIG. 3B.

The heat resistance depended on the thickness (t) of the $(Co_{90}Fe_{10})_{100-x}B_x$. The heat treatment had no effect on the film when the thickness (t) of the film was 2 nm as shown in FIG. 4. Thus, the $(Co_{90}Fe_{10})_{100-x}B_x$ film requires a thickness of not less than 4 nm. This fact indicates that the barrier property of the $(Co_{90}Fe_{10})_{100-x}B_x$ film against Cu depended on the thickness (t) of the film.

For the sake of further improving the heat resistance, it is appropriate that a cobalt-iron type alloy layer is formed not only on the bordering side, which borders on the nonmagnetic metal layer 14, of the free magnetic layer 13 but also on the bordering side of the pinning magnetic layer 15. The case of forming the pinning magnetic layer 15 itself with a cobalt-iron type alloy layer, or the case of forming the pinning magnetic layer 15 with a two-layer film consisting of a cobalt-iron type alloy layer and an NiFe film is conceivable.

Figure 5A:
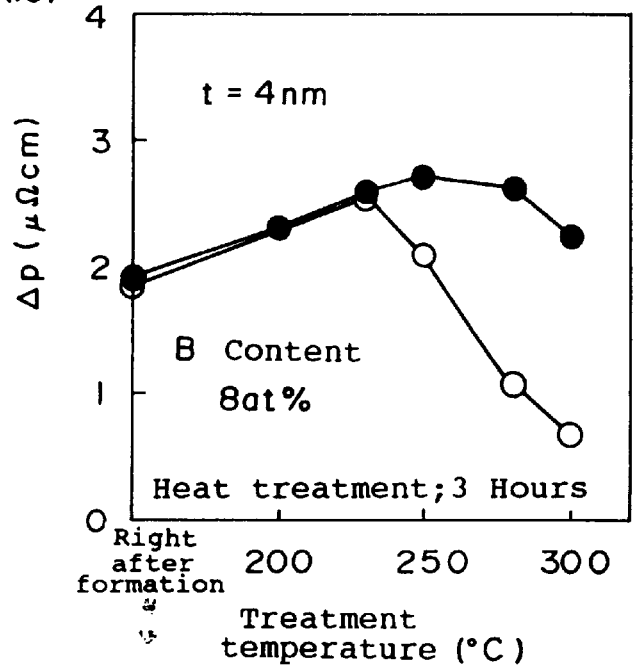
FIG. 5A is a comparative characteristic diagram showing the pattern of the change in electric resistivity of the magnetoresistive transducer of another structure of superposition according to one embodiment of this invention relative to the temperature of the heat treatment.
Figure 5B:
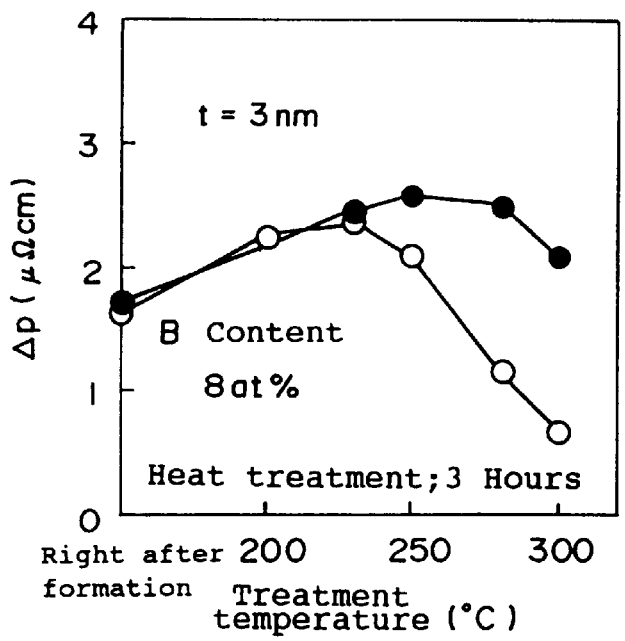
FIG. 5B is a characteristic diagram showing the pattern of the change in electric resistivity of the magnetoresistive transducer of the same structure of superposition as that of FIG. 5A and having the thickness of the $(Co_{90}Fe_{10})_{100-x}B_x$ alloy film decreased relative to the temperature of the heat treatment.

Incidentally, it has been experimentally confirmed that the heat resistance was varied by a difference in the structure of superposition as illustrated in FIG. 5A and FIG. 5B even when a cobalt-iron type alloy layer was formed on the side bordering on the nonmagnetic layer 14. This fact deserves due attention. To be specific, when the thickness of the cobalt-iron type alloy layer of the pinning magnetic layer 15 is decreased to the neighborhood of 3 nm, for example, the heat resistance was higher when the layer was formed of a two-layer film consisting of a cobalt-iron type alloy layer and an NiFe film than when the film was formed solely of a cobalt-iron alloy layer. The results of this study will be described below.

FIG. 5A is a characteristic diagram illustrating the pattern of the variation in the rate of change, $\Delta\rho$, in electric resistivity of a spin valve film having a different structure of superposition in the pinning magnetic layer 15 relative to the temperature of the heat treatment. The case of forming the pinning magnetic layer 15 with a $(Co_{90}Fe_{10})_{100-x}B_x$ film alone (indicated by an open circle) and the case of forming the pinning magnetic layer 15 with a two-layer film consisting of a $(Co_{90}Fe_{10})_{100-x}B_x$ film and an NiFe film, 1 nm in thickness (indicated by a full circle), were compared. In either case, the thickness, t, of the $(Co_{90}Fe_{10})_{100-x}B_x$ film on the free magnetic layer 13 side was set at 4 nm and that of the $(Co_{90}Fe_{10})_{100-x}B_x$ film on the pinning magnetic layer 15 at 3 nm. The amount of B (atomic fraction) added to the $(Co_{90}Fe_{10})_{100-x}B_x$ film was invariably set at 8 at % in either case.

For the sake of the study, the temperature of the heat treatment was varied in the range of 200°~300° C. For each of the temperature conditions, the duration of the heat treatment was fixed at 3 hours.

It is noted from the results of the test that in the case of the pinning magnetic layer 15 formed of a two-layer film consisting of a $(Co_{90}Fe_{10})_{100-x}B_x$ film and an NiFe film, 1 nm in thickness (full circle), the rate of change, $\Delta\rho$, did not fall from the initial value (about 1.9 $\mu\Omega$cm) within the range of temperatures used for the test. In the case of the pinning magnetic layer 15 formed of a $(Co_{90}Fe_{10})_{100-x}B_x$ film alone (open circle), the rate of change, $\Delta\rho$, began to fall at a temperature of 230° C., grew smaller than the initial value in the neighborhood of 250° C., and eventually reached 0.6 $\mu\Omega$cm when the temperature was at 300° C.

FIG. 5B shows the results of the same test as in FIG. 5A obtained when the thickness, t, of the $(Co_{90}Fe_{10})_{100-x}B_x$ film in the free magnetic layer 13 was decreased to 3 nm. The results of the same test as shown in FIG. 5A are described below. The results are substantially the same as those of FIG. 5A.

The reason for the difference between the case of forming the pinning magnetic layer 15 solely with a cobalt-iron type alloy and the case of forming the pinning magnetic layer 15 with a two-layer film consisting of a cobalt-iron type alloy layer and an NiFe film remains yet to be elucidated.

(B) The following four samples (a) to (d) were prepared for the study on the heat resistance. The samples (a) and (c) used the structure of superposition illustrated in FIG. 11D and the samples (b) and (d) used the structure of superposition illustrated in FIG. 11C. The structures of superposition on the free magnetic layer 13 were both identical with the structure of superposition of FIG. 11A.

In the four samples (a) to (d) alike, an alumina film 12a was formed on an altic substrate 11 and an antiferromagnetic layer 16a formed of an NiO film, 50 nm in thickness, the pinning magnetic layer 15, the nonmagnetic metal layer 14 formed of a Cu film, 3.2 nm in thickness, the free magnetic layer 13 formed of a two-layer film consisting of the $(Co_{90}Fe_{10})_{100-x}B_x$ film 13a, 4 nm in thickness, and the NiFe film 13b, 3.5 nm in thickness, and the cap layer formed of a Ta film, 10 nm in thickness, were sequentially laminated in the order mentioned on the alumina film 12a. In the magnetic material containing cobalt and iron and represented by the formula, $(Co_{90}Fe_{10})_{100-x}B_x$ the atomic fraction of cobalt (Co) was set at 90 at % and the atomic fraction of iron (F) at 10 at %. In this case, the magnetic material containing cobalt and iron and represented by the formula, $(Co_{90}Fe_{10})_{100-x}B_x$, possessed the best soft magnetic property. These atomic fractions are inevitably fluctuated in the actual formation of the film. For the purpose of attaining a satisfactorily high rate of change, $\Delta\rho$, however, it is proper that the atomic fraction of Co fall in the range of 85 to 95 at % and the atomic fraction of Fe in the range of 15 to 5 at %.

In each of the samples (a) and (c) mentioned above, the pinning magnetic layer 15 was formed of a two-layer film consisting of an NiFe film 15b, 2 nm in thickness, and a $(Co_{90}Fe_{10})_{100-x}B_x$ film 15a, 2 nm in thickness, bordering on the nonmagnetic metal layer 14. The B content was set at 5% in the sample (a) and at 10% in the sample (c). In either of the samples (b) and (d), the pinning magnetic layer 15 was formed of a one-layer film consisting solely of a $(Co_{90}Fe_{10})_{100-x}B_x$ film 15a, 4 nm in thickness. The B content was set at 5% in the sample (b) and at 10% in the sample (d).

Figure 3B:
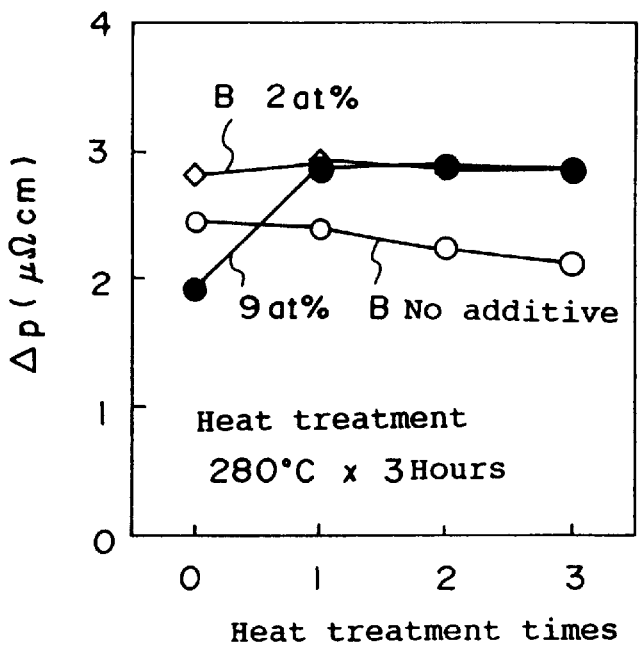
FIG. 3B is a characteristic diagram illustrating the pattern of the change in electric resistivity of the magnetoresistive transducer according to one embodiment of this invention relative to the number of heat treatments.
Figure 3C:
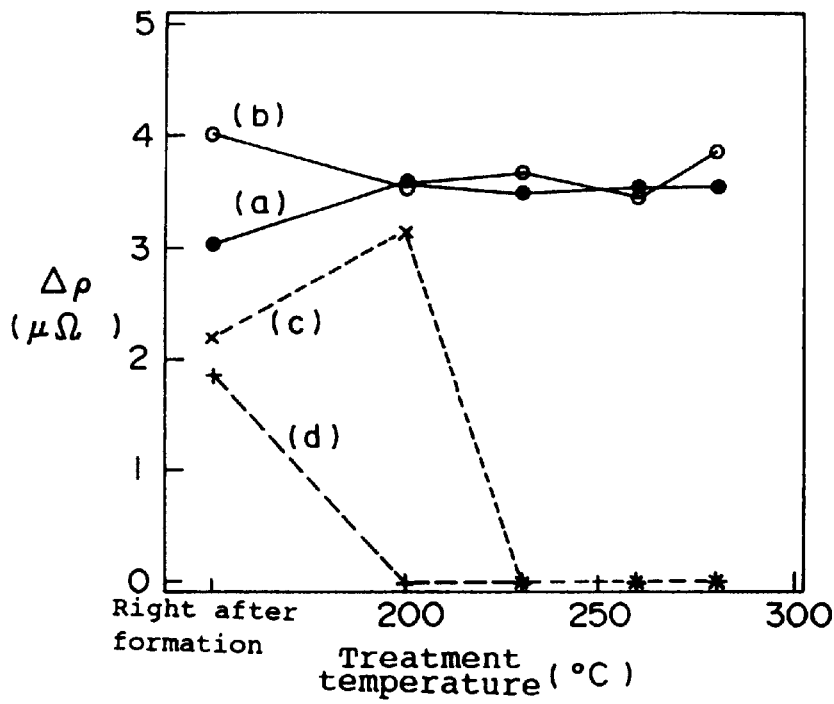
FIG. 3C is a characteristic diagram illustrating the pattern of the change in electric resistivity of another magnetoresistive transducer according to one embodiment of this invention relative to the temperature of heat treatments.

FIG. 3C is a characteristic diagram illustrating the pattern of the change in the rate of change, $\Delta\rho$, in electric resistivity relative to the temperature of the heat treatment. The vertical axis represents the rate of change, $\Delta\rho$ ($\mu\Omega$cm), of electric resistivity expressed on the linear scale and the horizontal axis the temperature of heat treatment (° C.) expressed on the linear scale. Further, the heat treatment was performed at either of the prescribed temperatures in a vacuum under application of a magnetic field of 2500 Oe for three hours.

From the results of the study, it is noted that the samples (a) and (b) both having a B content of 5% in the $(Co_{90}Fe_{10})_{100-x}B_x$ film showed no decline of the rate of change, $\Delta\rho$, at temperatures up to about 280° C. as illustrated in FIG. 3C. The heat resistance is not different when the pinning magnetic layer 15 has a one-layer structure and when it has a two-layer structure.

In contrast, the samples (c) and (d) both having a B content of 5% in the $(Co_{90}Fe_{10})_{100-x}B_x$ film showed a decrease in the rate of change, $\Delta\rho$, at low temperatures, indicating that the samples had low heat resistance. The heat resistance was different when the pinning magnetic layer 15 had a one-layer structure and when it had a two-layer structure. The one-layer structure had the rate of change, $\Delta\rho$, lowered to 0 at 200° C., whereas the two-layer structure had the rate of change, $\Delta\rho$, not lowered at 200° C. but lowered to 0 at 230° C.

(Study on Crystal Structure)

Figure 6:
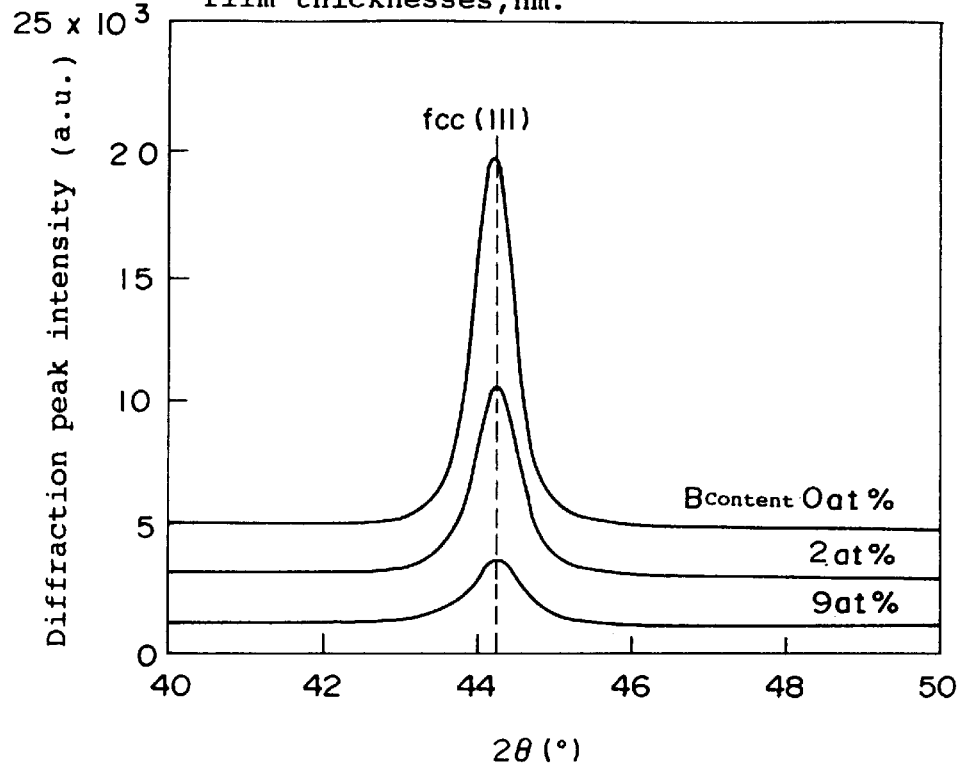
FIG. 6 is a diagram showing the diffraction peak intensity of the angle of incidence of the X ray on the $(Co_{90}Fe_{10})_{100-x}B_x$ alloy film used in the magnetoresistive transducer according to one embodiment of this invention relative to the double angle, 2θ.

FIG. 6 represents the crystal structure of a $(Co_{90}Fe_{10})_{100-x}B_x$ alloy film determined by means of the X-ray diffraction.

The vertical axis represents the diffraction peak intensity expressed by an arbitrary unit and the horizontal axis the double angle, 2θ (°), of the angle of incidence of the X-ray expressed on the linear scale. The double angle of an incidence plotted on the horizontal axis corresponds to the crystal face and the height of the diffraction peak plotted on the vertical axis indicates the degree to which the crystals parallel to a specific crystal face are present in the alloy.

The sample used in this test had a structure obtained by superposing an Si film, 10 nm in thickness, a Ta film, 10 nm in thickness, an NiFe film, 4.5 nm in thickness, a $Co_{90}Fe_{10}B$ film, 20 nm in thickness, and a Ta film, 10 nm in thickness, sequentially in the order mentioned.

In FIG. 6, the diffraction peak fell where the double angle, 2θ, of the incidence was about 44.3°. This fact indicates that the X ray diffracted in the (111) plane of crystal. The alloy film containing no B showed the highest peak. The height of the peak decreased in proportion as the B content increased. The angle of the incidence in which a diffraction peak comes showed no change. Though the (111) plane decreased in proportion as the B content increased, the fcc (face-centered cubic) lattice structure remained intact.

Figure 7:
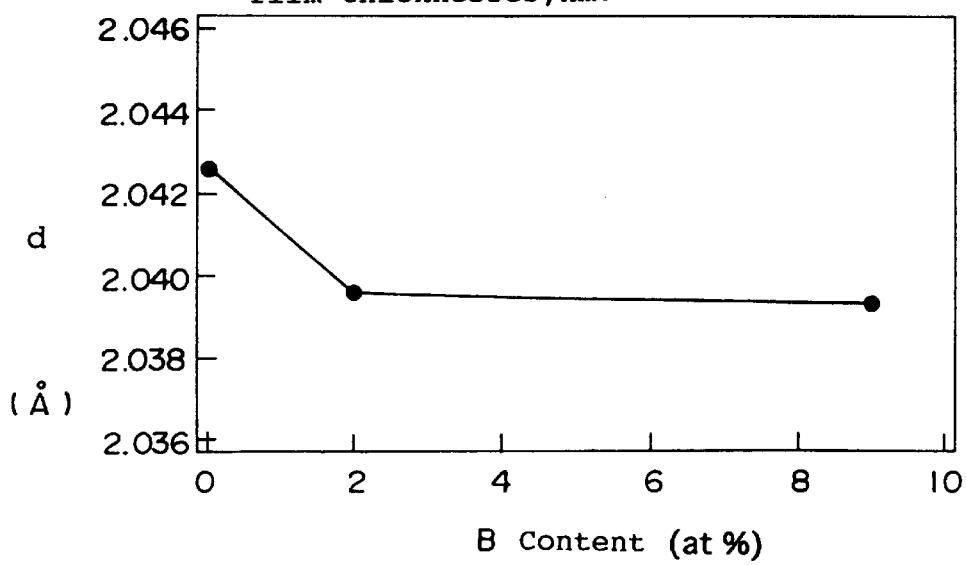
FIG. 7 is a diagram showing the pattern of the change in d spacing of the $(Co_{90}Fe_{10})_{100-x}B_x$ alloy film used in the magnetoresistive transducer according to one embodiment of this invention relative to the boron (B) content.

FIG. 7 is a characteristic diagram illustrating the pattern of the change in the d spacing relative to the B content. The vertical axis represents the d spacing (Å) expressed on the linear scale and the horizontal axis the B content (atomic fraction) (at %) expressed on the linear scale.

The sample used in this test had a structure obtained by superposing a Ta film, 10 nm in thickness, an NiFe film, 4.5 nm in thickness, a $Co_{90}Fe_{10}B$ film, 20 nm in thickness, and a Ta film, 10 nm in thickness, sequentially in the order mentioned.

The results of the test indicate that the addition of B lowered the d spacing from not less than 2.042 Å to not more than 2.040 Å.

From the results of the test on the crystal structure and the heat resistance mentioned above, it is clearly noted that the addition of boron decreased the d spacing of the $Co_{90}Fe_{10}B$ alloy film of the fcc lattice structure and that the decrease of the d spacing improved the barrier property of the film against Cu and exalted the heat resistance of the film.

Incidentally, when the film obtained by adding carbon (C) to a $Co_{90}Fe_{10}$ film was used, the consequently produced alloy film showed a high barrier property against Cu.

(2) First Through Ninth Embodiments

First Embodiment

FIG. 2A is a perspective view of a magnetoresistive (MR effect) transducer according to the first embodiment of this invention. FIG. 2B is a cross section taken along the line II—II in FIG. 2A.

The ground layer 12 formed of a Ta film, 5 nm in thickness, is deposited on the altic substrate 11 produced by coating the surface of a TiC substrate with an alumina film as illustrated in FIG. 2A.

Further, on the ground layer 12, the free magnetic layer 13 formed of a two-layer film consisting of an NiFe film (first soft magnetic layer) 13a, 3.5 nm in thickness, and a $(Co_{90}Fe_{10})_{100-x}Z_x$ film (cobalt-iron type alloy film) 13b, 4 nm in thickness, the nonmagnetic metal layer 14 formed of a Cu film, 3.2 nm in thickness, and the pinning magnetic layer (second soft magnetic layer) 15 formed of a $(Co_{90}Fe_{10})_{100-x}Z_x$ film (cobalt-iron type alloy film), 4 nm in thickness are sequentially superposed in the order mentioned. On the pinning magnetic layer 15, the antiferromagnetic layer 16 formed of an FeMn film, 10 nm in thickness, and the cap layer 17 formed of a Ta film, 10 nm in thickness, are sequentially superposed in the order mentioned. The $(Co_{90}Fe_{10})_{100-x}Z_x$ films which severally constitute the free magnetic layer 13 and the pinning magnetic layer 15 contain boron (B) or carbon (C) represented by the symbol Z at a prescribed proportion, respectively.

On the cap layer 17, outlet electrodes 18a and 18b formed of a Au film are deposited one each in the opposite terminal parts across the sense area (SA). A sense current is led out of one of the outlet electrodes 18a and 18b into the sense area (SA) and the sense current is led out of the other outlet electrode 18b or 18a.

The pinning magnetic layer 15 may be formed of a two-layer film consisting of a CoFe type alloy layer on the nonmagnetic metal layer 14 side and an NiFe type alloy layer.

A NiFe type alloy layer such as, for example, an NiFeCr film, NiFeNb film, NiFeRh film, or NiFeTa film which contains other element than NiFe may be used in the place of the NiFe film which constitutes the free magnetic layer 13 or the pinning magnetic layer 15. These NiFe type alloys are at an advantage in having an extremely small anisotropic magnetoresistive (AMR) effect, a noise for the spin valve magnetoresistance, as compared with NiFe.

Figure 2C:
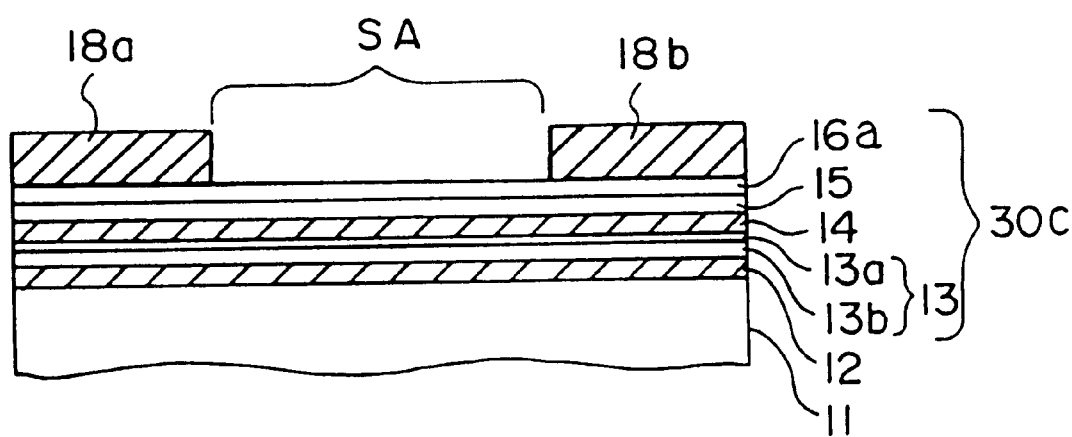
FIG. 2C is a cross section illustrating another magnetoresistive transducer according to the first embodiment of this invention.
Figure 2D:
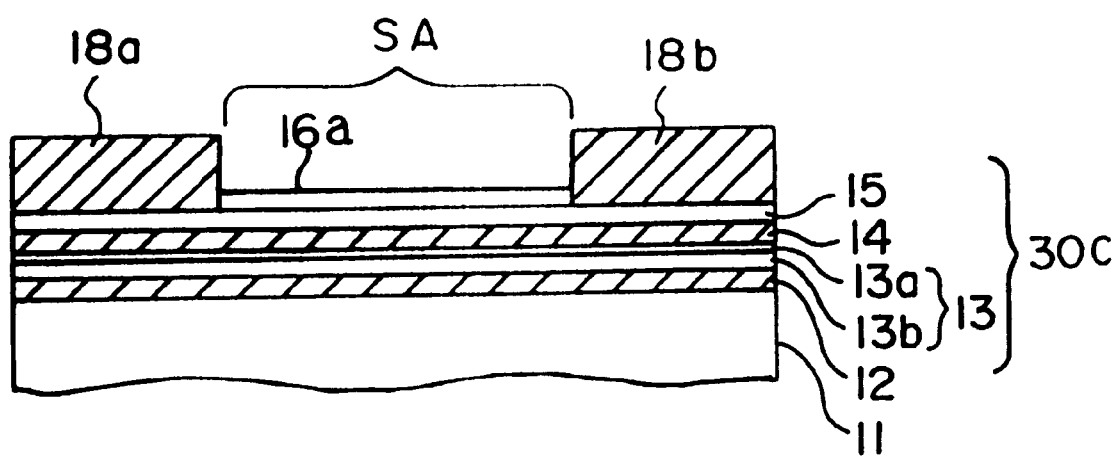

Further, it is allowable to use a NiO film, $\alpha$-$Fe_2O_3$ film, NiMn film, PtMn film, PdMn film, PdPtMn film, CrMn film, or IrMn film as the antiferromagnetic layer 16. When the NiO film or $\alpha$-$Fe_2O_3$ film is used, since the NiO film or $\alpha$-$Fe_2O_3$ film possesses an insulating property, it is formed solely in the sense area (SA) and the cap layer 17 is not formed on the NiO film or $\alpha$-$Fe_2O_3$ film 16a as shown in a structure of superposition 30C in FIG. 2C. Thus, the outlet electrodes 18a and 18b are formed directly on the pinning magnetic layer 15.

Now, the method for the formation of the magnetoresistive transducer mentioned above will be described below with reference to FIG. 2A and FIG. 2B.

First, on the altic substrate 11 which has a (100) plane, the ground layer 12 formed of a Ta film, 5 nm in thickness, the NiFe film (first soft magnetic layer) 13b, 3.5 nm in thickness, the $(Co_{90}Fe_{10})_{100-x}B_x$ film (cobalt-iron type alloy film) 13a, 4 nm in thickness, the nonmagnetic metal layer 14 formed of a Cu film, 3.2 nm in thickness, the $(Co_{90}Fe_{10})_{100-x}B_x$ film (second soft magnetic layer) 15, 4 nm in thickness, the FeMn film 16, 10 nm in thickness, and the cap layer 17 formed of a Ta film, 10 nm in thickness, are superposed by the sputtering technique under application of a magnetic field of 30 Oe. The $(Co_{90}Fe_{10})_{100-x}B_x$ film 13a and the NiFe film 13b jointly serve as the free magnetic layer 13 and the $(Co_{90}Fe_{10})_{100-x}B_x$ film 15 serves as the pinning magnetic layer.

Here, the $(Co_{90}Fe_{10})_{100-x}B_x$ films 13a and 15 are formed by sputtering a target having Co, Fe, and B applied thereto in a prescribed surface area ratio with Ar gas of a pressure of 0.3 Pa in a chamber of an inner pressure of not higher than $5\times10^{-5}$ Pa.

Next, in a vacuum chamber, the FeMn film 16 is endowed with antiferromagnetism by a heat treatment performed in a vacuum at 230° C. for four hours under application of a magnetic field of about 2000 Oe. This treatment gives rise to a bias magnetic field.

Then, the Au film is deposited and patterned to form outlet electrodes 18a and 18b made of Au film in the opposite terminal parts on the cap layer 17 to consequently complete an MR effect transducer.

In the MR effect transducer mentioned above, the $(Co_{90}Fe_{10})_{100-x}B_x$ films 13a and 15 enjoy good crystallinity and give rise to an fcc lattice structure because the $(Co_{90}Fe_{10})_{100-x}B_x$ film is not directly deposited on the altic substrate 11 and the upper layers are superposed through the medium of the ground layer 12 formed of a Ta film and the NiFe film 13a. Owing to the addition of B, the $(Co_{90}Fe_{10})_{100-x}B_x$ film has a smaller d spacing than the d spacing of the $Co_{90}Fe_{10}$ alloy.

The results of test shown in FIG. 3A and FIG. 3B indicate that the present embodiment improves the $(Co_{90}Fe_{10})_{100-x}B_x$ films 13a and 15 in the barrier property against Cu and endows the MR effect transducer with exalted heat resistance.

Second Embodiment

Figure 11A:
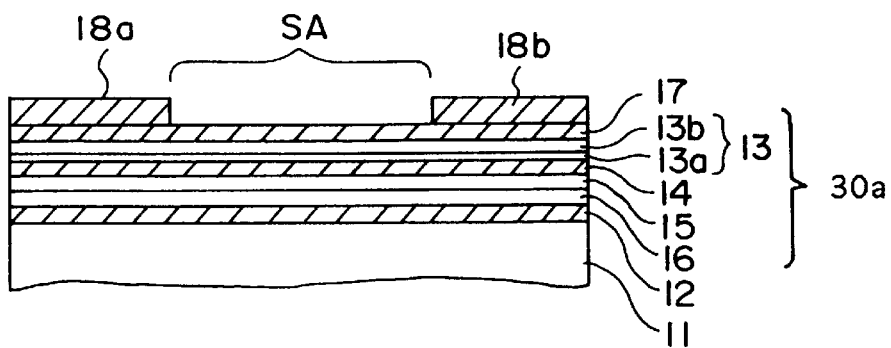
FIG. 11A is a cross section illustrating a spin valve magnetoresistive transducer according to the second embodiment of this invention.

By reversing the structure of superposition mentioned above, the ground layer 12 formed of a Ta film, the antiferromagnetic layer 16 formed of an FeMn film, the pinning magnetic layer 15 formed of a $(Co_{90}Fe_{10})_{100-x}B_x$ film (fourth soft magnetic layer), the nonmagnetic metal layer 14 formed of a Cu film, the $(Co_{90}Fe_{10})_{100-x}B_x$ film 13a, the NiFe film (fifth soft magnetic layer) 13b, and the cap layer 17 may be sequentially laminated in the order mentioned on the altic substrate 11 as illustrated in FIG. 11A. Then, the outlet electrodes 18a and 18b for guiding a sense current are formed one each in the opposite terminal parts of the cap layer 17.

In the structure mentioned above, since the antiferromagnetic layer 16 formed of an FeMn film is directly superposed on the ground layer 12 formed of a Ta film and such layers as an NiFe film do not intervene therebetween, the FeMn film 16 and the $(Co_{90}Fe_{10})_{100-x}B_x$ film 15 are dubious about crystallinity. The dubious crystallinity, however, poses no problem because these films are pinning magnetic layers. Since the $(Co_{90}Fe_{10})_{100-x}B_x$ film 13a of the free magnetic layer 13 is deposited on the Cu film 14, it enjoys good crystallinity and constitutes itself an fcc lattice structure. Optionally, the $(Co_{90}Fe_{10})_{100-x}B_x$ films 13a and 15 may be improved in crystallinity and ensured to acquire an fcc lattice structure infallibly by interposing an NiFe film between the ground layer 12 formed of a Ta film and the antiferromagnetic layer 16 formed of an FeMn film or between the antiferromagnetic layer 16 and the $(Co_{90}Fe_{10})_{100-x}B_x$ film 15.

Third Embodiment

Figure 11B:
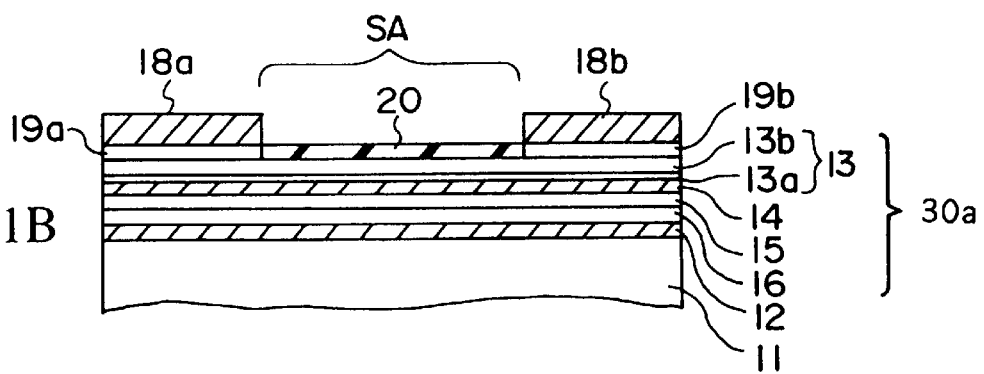
FIG. 11B is a cross section illustrating a magnetoresistive transducer according to the third embodiment of this invention.
Figure 11C:
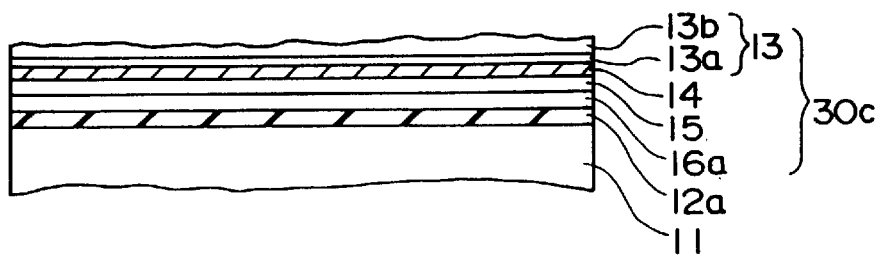
FIG. 11C and FIG. 11D are cross sections illustrating the other spin valve magnetoresistive transducers according to the second and the third embodiment of this invention.

Antiferromagnetic layers 19a and 19b formed of an FeMn alloy may be formed as illustrated in FIG. 11B one each in the opposite terminal parts of the NiFe film 13b of the free magnetic layer 13 serving to change the direction of magnetization of the uppermost layer in the structure of FIG. 11A. By this setup, the direction of magnetization of the free magnetic layer 13 is made uniform in the absence of a signal magnetic field and enabled to acquire magnetoresistivity of good linearity. In the diagram, 20 stands for an insulating protective layer for covering a sense area.

In either of the MR transducers of FIG. 11A and FIG. 11B, the $(Co_{90}Fe_{10})_{100-x}B_x$ film enjoys good crystallinity and gives rise to an fcc lattice structure because the $(Co_{90}Fe_{10})_{100-x}B_x$ film is not directly deposited on the altic substrate 11 and the upper layers are laminated through the medium of the ground layer 12 formed of a Ta film. Further, owing to the addition of B, the $(Co_{90}Fe_{10})_{100-x}B_x$ film has a smaller d spacing than the d spacing of the $Co_{90}Fe_{10}$ alloy.

This embodiment, therefore, improves the $(Co_{90}Fe_{10})_{100-x}B_x$ film in the barrier property against Cu and endows the MR effect transducer with exalted heat resistance.

Figure 11D:
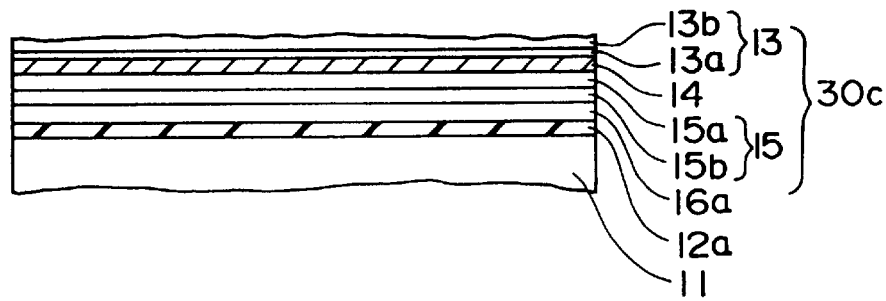

The second and the third embodiment cited above represent the cases of using an FeMn film for the antiferromagnetic layer 16. It is allowable, however, to use a NiO film, $\alpha$-$Fe_2O_3$ film, NiMn film, PtMn film, PdMn film, PdPtMn film, CrMn film, or IrMn film instead. In the case of the NiO film or $\alpha$-$Fe_2O_3$ film 16a, however, it is appropriate that the NiO film or $\alpha$-$Fe_2O_3$ film be deposited on the altic substrate 11 through the medium of an alumina film 12a as illustrated in a structure of superposition 30C FIG. 11C and FIG. 11D. Otherwise, the NiO film or $\alpha$-$Fe_2O_3$ film may be deposited directly on the altic substrate 11. The pinning magnetic layer 15 is preferably formed in a two-layer structure consisting of a $(Co_{90}Fe_{10})_{100-x}B_x$ film 15a and an NiFe film 15b as illustrated in FIG. 11D. In this case, the $(Co_{90}Fe_{10})_{100-x}B_x$ film 15a is disposed on the nonmagnetic layer 14 side.

The third embodiment represents the case of using FeM film for the other antiferromagnetic layers 19a and 19b. It is allowable, however, to use an NiMn film, PtMn film, PdMn film, PdPtMn film, CrMn film, or IrMn film instead.

Fourth Embodiment

Figure 12A:
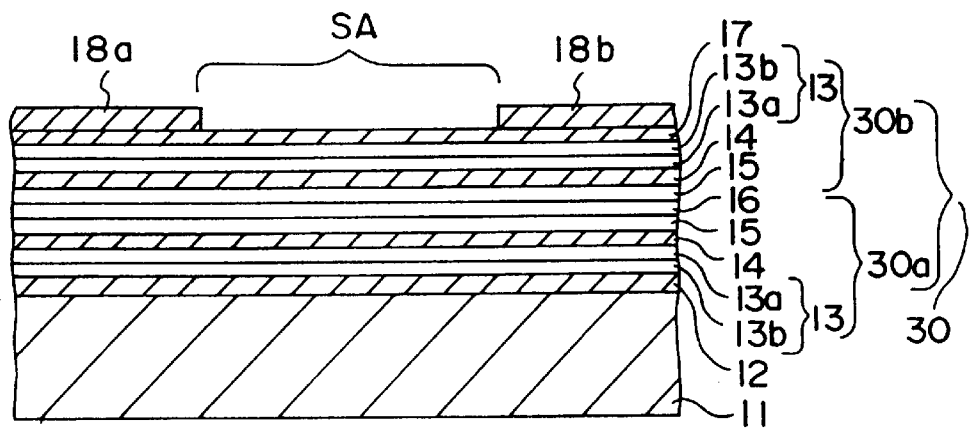
FIG. 12A is a cross section illustrating a spin valve magnetoresistive transducer according to the fourth embodiment of this invention.

FIG. 12A is a cross section illustrating an MR transducer according to the fourth embodiment of this invention.

The fourth embodiment comprises a structure of superposition 30a consisting, as illustrated in FIG. 2B, of the NiFe film 13b, the $(Co_{90}Fe_{10})_{100-x}B_x$ film 13a, the Cu film 14, the $(Co_{90}Fe_{10})_{100-x}B_x$ film 15, and the FeMn film 16, the antiferromagnetic layer 16 as a central layer, and a structure of superposition 30b which is symmetrical to the structure of superposition 30a relative to the central layer. This setup contributes to enhancing the sensitivity. In FIG. 12A, like parts found in FIG. 2B are denoted by like reference numerals.

In this case as in the case of the first embodiment, the $(Co_{90}Fe_{10})_{100-x}B_x$ film enjoys good crystallinity and gives rise to an fcc lattice structure because the $(Co_{90}Fe_{10})_{100-x}B_x$ film is not directly deposited on the altic substrate 11 and the upper layers are superposed through the medium of the ground layer 12 formed of a Ta film. Owing to the addition of B, the $(Co_{90}Fe_{10})_{100-x}B_x$ film has a smaller d spacing than the d spacing of the $Co_{90}Fe_{10}$ alloy.

The results of the study shown in FIG. 3A and FIG. 3B indicate that the present embodiment improves the barrier property against Cu and exalts the heat resistance.

Fifth Embodiment

Figure 12B:
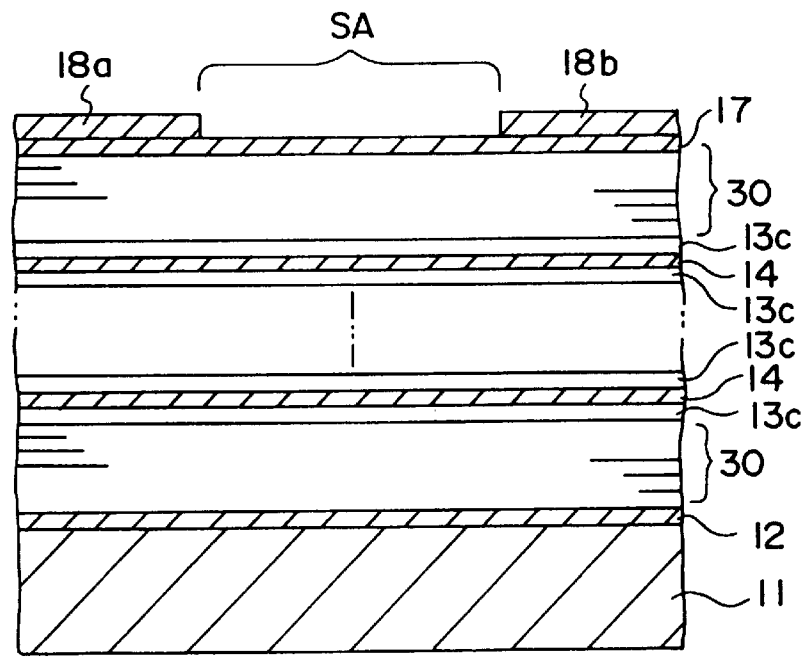
FIG. 12B is a cross section illustrating a spin valve magnetoresistive transducer according to the fifth embodiment of this invention.

FIG. 12B is a cross section illustrating an MR transducer according to the fifth embodiment of this invention.

This embodiment differs from the fourth embodiment in respect that a plurality of structures of superposition 30 each consisting of a set of structures of superposition 30a and 30b are superposed through the medium of the three layers, i.e. a $(Co_{90}Fe_{10})_{100-x}B_x$ film (cobalt-iron type alloy film) 13c, a nonmagnetic metal layer 14 formed of a Cu film, and a $(Co_{90}Fe_{10})_{100-x}B_x$ film 13c.

Again in this case as in the case of the first embodiment, the $(Co_{90}Fe_{10})_{100-x}B_x$ film enjoys good crystallinity and gives rise to an fcc lattice structure because the $(Co_{90}Fe_{10})_{100-x}B_x$ film is not directly deposited on the altic substrate 11 and the upper layers are superposed through the medium of the ground layer 12 formed of a Ta film. Owing to the addition of B, the $(Co_{90}Fe_{10})_{100-x}B_x$ film has a smaller d spacing than the d spacing of the $Co_{90}Fe_{10}$ alloy.

The results of the study shown in FIG. 3A and FIG. 3B indicate that the present embodiment improves the $(Co_{90}Fe_{10})_{100-x}B_x$ film in the barrier property against Cu and endows it with exalted heat resistance.

In the fourth and the fifth embodiments, an NiMn film, PtMn film, PdMn film, PdPtMn film, CrMn film, or IrMn film may be used for the antiferromagnetic layer 16. The NiO film or $\alpha$-$Fe_2O_3$ film cannot be used therefor, however, because they have an insulating property.

Sixth Embodiment

Figure 13A:
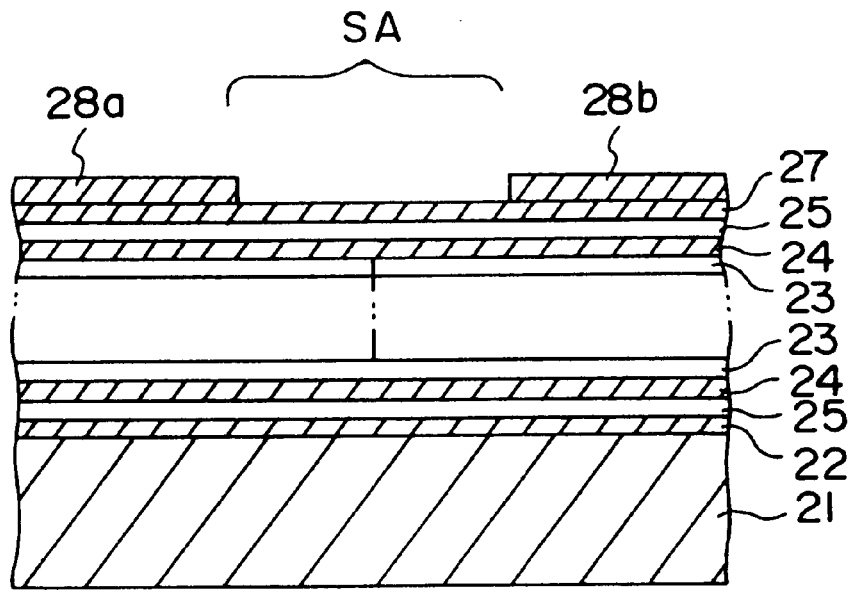
FIG. 13A is a cross section illustrating an artificial lattice magnetoresistive transducer according to the sixth embodiment of this invention.

FIG. 13A is a cross section illustrating an MR effect transducer according to the sixth embodiment of this invention. This MR effect transducer has the structure of a magnetoresistive artificial lattice film.

A ground layer 22 formed of a Ta film, about 5 nm in thickness, is deposited on an altic substrate 21 as illustrated in FIG. 13A. On the ground layer 22, soft magnetic films 25 and 23 and a nonmagnetic metal film 24 formed of a Cu film, about 3.2 nm in thickness, are alternately superposed. On the uppermost part of the superposed layers, a cap layer 27 formed of a Ta film is deposited. On the cap layer 27, outlet electrodes 28a and 28b are formed.

Figure 13B:
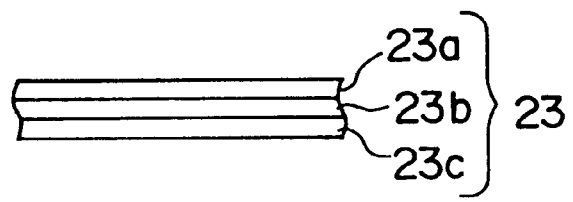
FIG. 13B and FIG. 13C are partial cross sections.

The soft magnetic layer 23 may be formed solely of a $(Co_{90}Fe_{10})_{100-x}B_x$ film (third cobalt-iron type alloy layer), about 4 nm in thickness, consisting of cobalt, iron, and other element. It may be, otherwise, in a three-layer structure consisting of a $(Co_{90}Fe_{10})_{100-x}B_x$ film (first cobalt-iron type alloy layer) 23a, about 4 nm in thickness, consisting of cobalt, iron, and other element, a NiFe film (third soft magnetic layer) 23b, about 1 nm in thickness, and a $(Co_{90}Fe_{10})_{100-x}B_x$ film (second cobalt-iron type alloy layer) 23c, about 4 nm in thickness, consisting of cobalt, iron, and other element as illustrated in FIG. 13B. In the case of the three-layer structure, either of the first and second cobalt-iron type alloy layers 23a and 23c is made to border on the Cu film 24.

The soft magnetic layer 25 which contacts the ground layer 22 and the cap layer 27 may be in a one-layer structure consisting of the $(Co_{90}Fe_{10})_{100-x}B_x$ film (third cobalt-iron type alloy layer), about 4 nm in thickness, consisting of cobalt, iron, and other element.

Figure 13C:
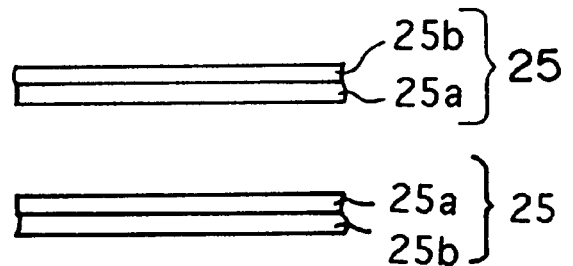

It may be, otherwise, in a two-layer structure consisting of a $(Co_{90}Fe_{10})_{100-x}B_x$ film (cobalt-iron type alloy layer) 25a, about 4 nm in thickness, consisting of cobalt, iron, and other element and an NiFe film (third soft magnetic layer) 25b, about 1 nm in thickness as illustrated in FIG. 13C. In FIG. 13C, the upper cross section illustrates the soft magnetic layer 25 intervening between the cap layer 17 and the Cu film 24 and the lower cross section illustrates the soft magnetic layer 24 intervening between the ground layer 22 and the Cu film 24.

Seventh Embodiment

Figure 14A:
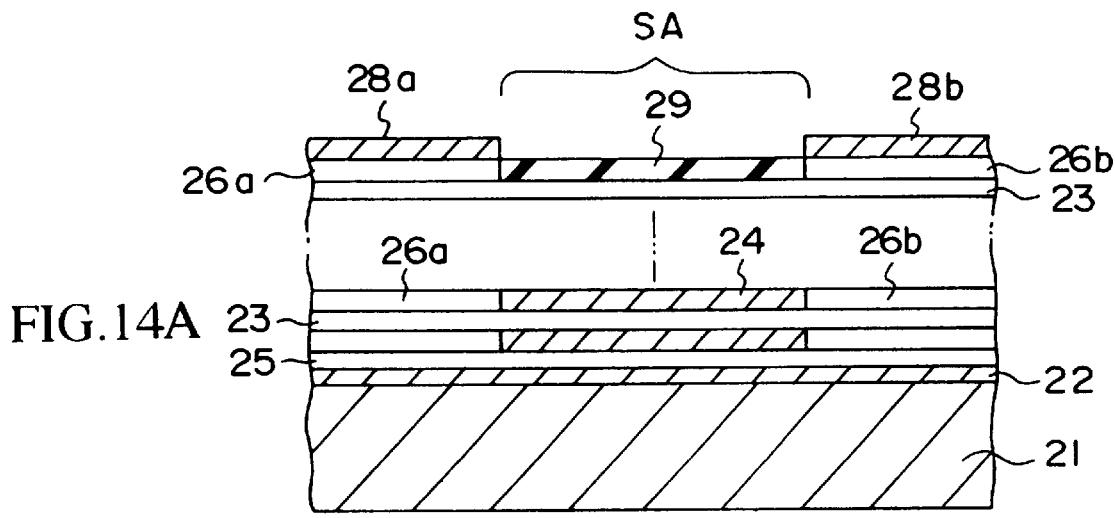
FIG. 14A is a cross section illustrating an artificial lattice magnetoresistive transducer according to the seventh embodiment of this invention.

FIG. 14A is a cross section illustrating an MR effect transducer according to the seventh embodiment of this invention. This MR effect transducer has the structure of a magnetoresistive artificial lattice film.

The seventh embodiment differs from the sixth embodiment in respect that two antiferromagnetic layers 26a and 26b, about 10 nm in thickness, are formed one each in the opposite terminal parts on either of the soft magnetic films 23 and 25 as illustrated FIG. 14A. By providing the soft magnetic layer 23 in the opposite terminal parts thereof with these antiferromagnetic layers 26a and 26b, the soft magnetic layer 23 is enabled to unify the direction of magnetization thereof in the absence of a signal magnetic field and gain in the linearity of the magnetoresistive characteristic thereof.

Further, outlet electrodes 28a and 28b are respectively formed on the two antiferromagnetic layers 26a and 26b in the uppermost part and an insulating film 29 for protecting the sense area (SA) is formed on the soft magnetic film 23 between the two antiferromagnetic layers 26a and 26b.

In FIG. 14A, like parts found in FIG. 13A to FIG. 13C are denoted by like reference numerals. The soft magnetic layers 23 and 25 each may be in a one-layer structure consisting of a $(Co_{90}Fe_{10})_{100-x}B_x$ film (third cobalt-iron type alloy layer). It may be, otherwise, a multi-layer structure including a $(Co_{90}Fe_{10})_{100-x}B_x$ film (third cobalt-iron type alloy layer) as illustrated in FIG. 13B and FIG. 13C.

Eighth Embodiment

Figure 14B:
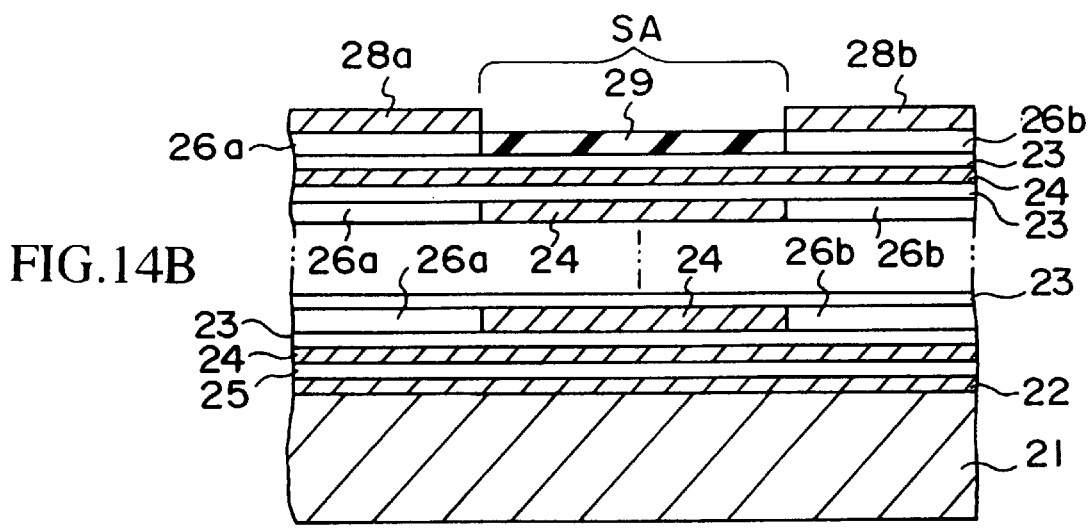
FIG. 14B is a cross section illustrating an artificial lattice magnetoresistive transducer according to the eighth embodiment of this invention.

FIG. 14B is a cross section illustrating an MR effect transducer according to the eighth embodiment of this invention. This MR effect transducer has the structure of a magnetoresistive artificial lattice film like that of the seventh embodiment.

The eighth embodiment differs from the seventh embodiment in respect that the soft magnetic layers 23 and the nonmagnetic metal layers 24 are alternately superposed and the antiferromagnetic layers 26a and 26b are formed contiguously to the surface of the soft magnetic layers 23 in the opposite terminal parts of every other soft magnetic layers 23.

In FIG. 14B, like parts found in FIG. 14A and FIG. 13A to FIG. 13C are denoted by like reference numerals. The soft magnetic layers 23 and 25 each may be in a onelayer structure consisting of a $(Co_{90}Fe_{10})_{100-x}B_x$ film (third cobalt-iron type alloy layer). It may be, otherwise, a multi-layer structure including a $(Co_{90}Fe_{10})_{100-x}B_x$ film (third cobalt-iron type alloy layer) as illustrated in FIG. 13B and FIG. 13C.

In the plurality of superposed soft magnetic layers 23, every third or later soft magnetic layers 23 may be provided in the opposite terminal parts thereof in a contiguous manner with the antiferromagnetic layers 26a and 26b.

In the sixth through eighth embodiments described above, the first and second cobalt-iron type alloy layers 23a, 23c, and 25a have a smaller d spacing than the d spacing of a cobalt-iron alloy because they each contain boron. Then, the third and fourth cobalt-iron type alloy layers 23a, 23c, and 25a enjoy good crystallinity and acquire a face-centered cubic lattice structure because they are superposed through the medium of the ground layer 22 and the NiFe film 25b.

The results of the study shown in FIG. 3A and FIG. 3B indicate that the present embodiment improves the $(Co_{90}Fe_{10})_{100-x}B_x$ film in the barrier property against Cu and endows the MR effect transducer with exalted heat resistance.

Incidentally, in the sixth through eighth embodiments described above, NiFe film must be interposed between the ground layer 22 and the $(Co_{90}Fe_{10})_{100-x}B_x$ film 25 for the purpose of enabling the $(Co_{90}Fe_{10})_{100-x}B_x$ films 23a, 23c, and 25 to acquire an fcc lattice structure.

It is allowable to use an NiMn film, PtMn film, PdMn film, PdPtMn film, CrMn film, or IrMn film instead of the FeMn film for the antiferromagnetic layers 26a and 26b. The NiO film or $\alpha$-$Fe_2O_3$ film cannot be used, however, because they have an insulating property.

Ninth Embodiment

Cobalt iron is used as the material for a free magnetic layer of a spin valve magnetoresistive type reproducing head (hereinafter referred to as "SVMR head"). By the incorporation of such an element as boron, carbon, or nitrogen in the cobalt iron, the anisotropic magnetoresistance of the free magnetic layer can be curbed as shown below.

Figure 15A:
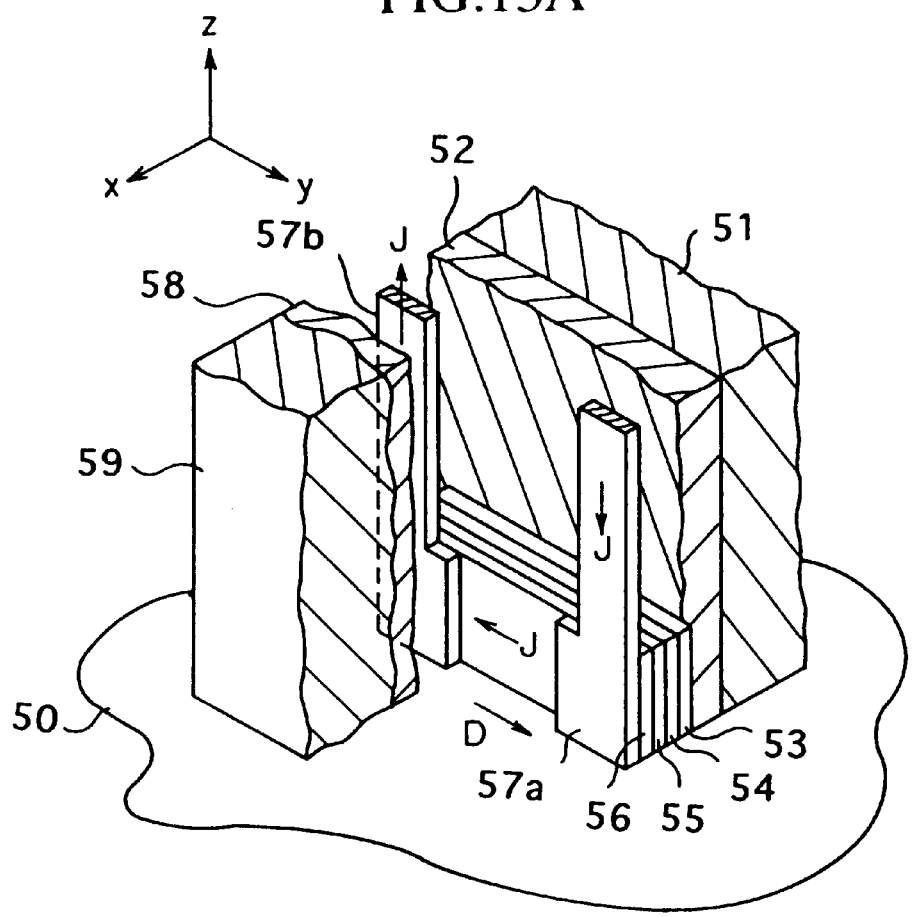
FIG. 15A is a perspective view illustrating the essential part of the SVMR head in X, Y and Z directions according to the ninth embodiment of this invention.

FIG. 15A is a perspective view illustrating the essential part of the SVMR head.

A first nonmagnetic insulating layer 52 made of $Al_2O_3$ is formed on a first magnetic shield layer 51 made of NiFe and a free magnetic layer 53 is formed on the first nonmagnetic insulating layer 52. The free magnetic layer 53 has a two-layer structure consisting of an NiFe layer and a $(CO_{90}Fe_{10})_{90}B_{10}$ layer. The subscripts in $(CO_{90}Fe_{10})_{90}B_{10}$ represent the atmic fraction (atoms % or at %).

Then, on the free magnetic layer 53, a nonmagnetic intermediate layer 54 made of Cu, a pinning magnetic layer 55 made of $(CO_{90}Fe_{10})_{90}B_{10}$, and an antiferromagnetic layer 56 made of FeMn are sequentially superposed in the order mentioned.

The component layers from the free magnetic layer 53 through the antiferromagnetic layer 56 are electrically joined and are patterned jointly in a rectangular shape on the first nonmagnetic insulating layer 52. A pair of leads (outlet electrodes) 57a and 57b which are made of gold or tungsten are formed in the opposite ends of the antiferromagnetic layer 56.

The antiferromagnetic layer 56, the leads 57a and 57b, etc. on the first nonmagnetic insulating layer 52 are covered with a second nonmagnetic insulating layer 58 made of $Al_2O_3$. A second magnetic shield layer 59 made of NiFe is formed on the second nonmagnetic insulating layer 58.

The free magnetic layer 53 has a thickness of 7.5 nm, the nonmagnetic intermediate layer 54 a thickness of 3 nm, the pinning magnetic layer 55 a thickness of 3 nm, and the antiferromagnetic layer 56 a thickness of 10 nm.

Figure 15B:
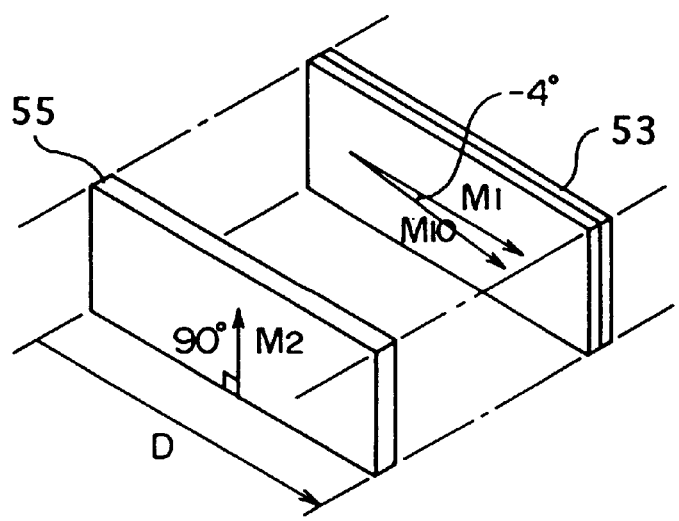
FIG. 15B is a perspective view showing a relationship between the direction of the magnetization of the free magnetic layer and that of the pinning magnetic layer in FIG. 15A.

In the SVMR head constructed as described above, the axis of easy magnetization $M_1$ of the free magnetic layer 53 is parallel to the counter surface of a magnetic recording medium 50 and coincides with the direction of width D of a track core as illustrated in FIG. 15B. The direction of magnetization $M_{10}$ of the free magnetic layer 53 tilts with an angle of $-4°$ from the axis of easy magnetization $M_1$ by passing a sense current J in the area intervening between the two leads 57a and 57b. The direction of the magnetization $M_2$ of the pinning magnetic layer 55 is enabled to form an angle of $+90°$ relative to the direction of width D of the track core by the exchange coupling force which is generated with the antiferromagnetic layer 56. The angles of the directions of magnetization $M_{10}$ and $M_2$ relative to the direction of width D of the track core assume minus magnitudes when they are made to tilt toward the magnetic recording medium 50 from the direction of width D of the track core and plus magnitudes when they are made to tilt toward the opposite side.

The free magnetic layer 53 has the magnitude of the electric resistance thereof varied by the variation of the relative angle between the direction of the sense current J and the direction of magnetization $M_{10}$. This variation in the magnitude of electric resistance is called an "anisotropic magnetoresistance effect (AMR effect)."

The magnitude of resistance increases in proportion as the unparallel component of the direction of magnetization $M_{10}$ of the free magnetic layer 53 relative to the direction of magnetization $M_2$ of the pinning magnetic layer 55 increased and the magnitude decreases in proportion as the parallel component thereof increases. This variation of the magnitude of electric resistance is called a "spin valve magnetoresistance effect (SV effect)."

When a signal magnetic field in the upward direction and a signal magnetic field in the downward direction from the magnetic recording medium 50 are severally reproduced by an SVMR head, the two reproduced signals are symmetrical about a certain value. Though the appropriateness of this symmetry grows with the perfection thereof, the symmetry is actually impaired by the AMR effect.

When a CoFe layer is used in the free magnetic layer 53 of the two-layer structure mentioned above, not only the SV effect but also the AMR effect of the SVMR head is inevitably increased. The incorporation of such an element as boron, carbon, or nitrogen in the alloy CoFe, however, has been found to result in diminishing the AMR effect as shown herein below.

First, the thickness ratio between the NiFe layer and the CoFeB layer, which form the two-layer structure of a fixed total thickness of 75 Å, was varied to study the effect of this variation on the AMR ratio of the two layers. The results of this study are shown by a continuous line in FIG. 16. It is noted from the graph that the AMR ratio decreased in proportion as the thickness of the CoFeB layer increased. The CoFeB was composed of 81 at % of Co, 9 at % of Fe, and 10 at % of boron. This two-layer structure will be referred to as a "first magnetic layer" herein below.

Then, the thickness ratio between the NiFe layer and the CoFe layer forming the two-layer structure of a fixed total thickness of 75 Å was varied to study the effect of this variation on the AMR ratio of the two layers. The results of this study are shown by a broken line in FIG. 16. It is noted from the graph that the AMR ratio increased in proportion as the thickness of the CoFe layer increased. This two-layer structure will be referred to as a "second magnetic layer" herein below.

The term "AMR ratio" refers to the ratio of the magnitude of resistance which is varied by the AMR effect when an external magnetic field is varied by a prescribed magnitude. The extent to which the symmetry of the SV effect is impaired increases in proportion as the value of the AMR ratio decreases.

Figure 16:
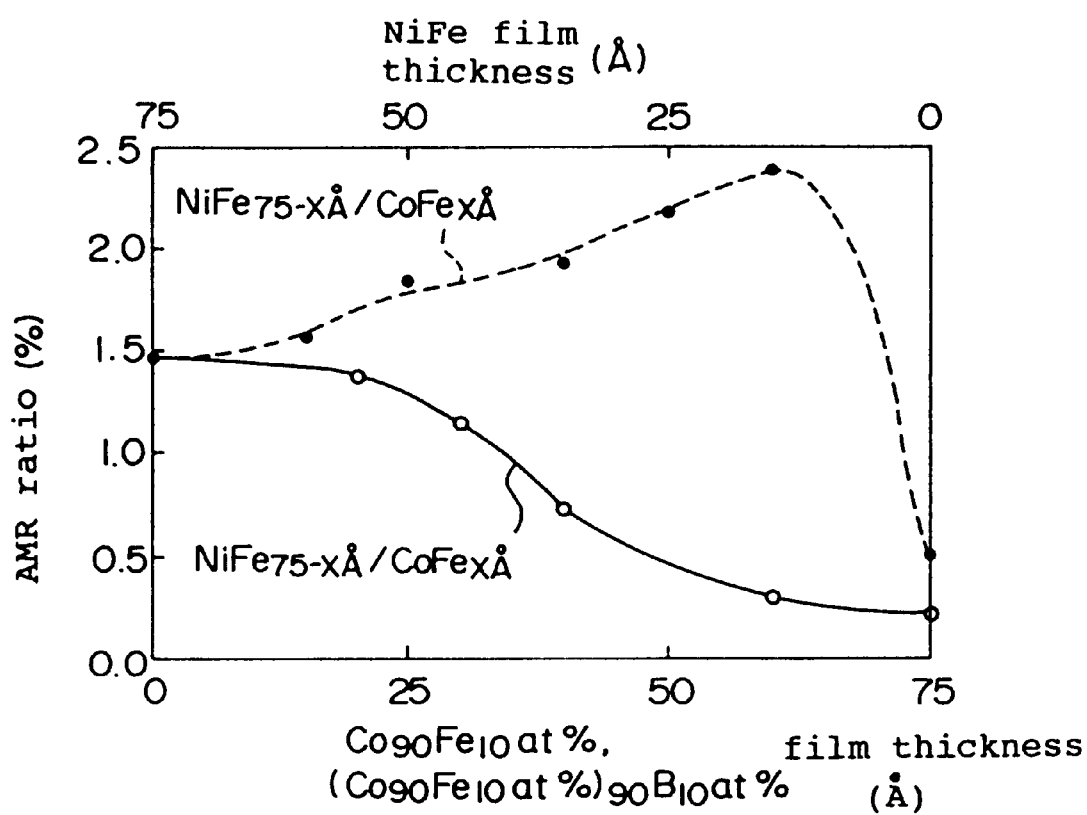
FIG. 16 is a characteristic diagram showing a relationship between the AMR ratio and the thickness of the CoFeB layer used in the SVMR head according to the ninth embodiment of this invention.

It is noted from FIG. 16 that the first magnetic layer has a smaller AMR ratio than the second magnetic layer, that the AMR ratio of the first magnetic layer decreased in proportion as the thickness of the CoFeB layer increased, and that the first magnetic layer, when formed wholly of a CoFeB layer, has an extremely small AMR ratio of about 0.2%.

Figure 17:
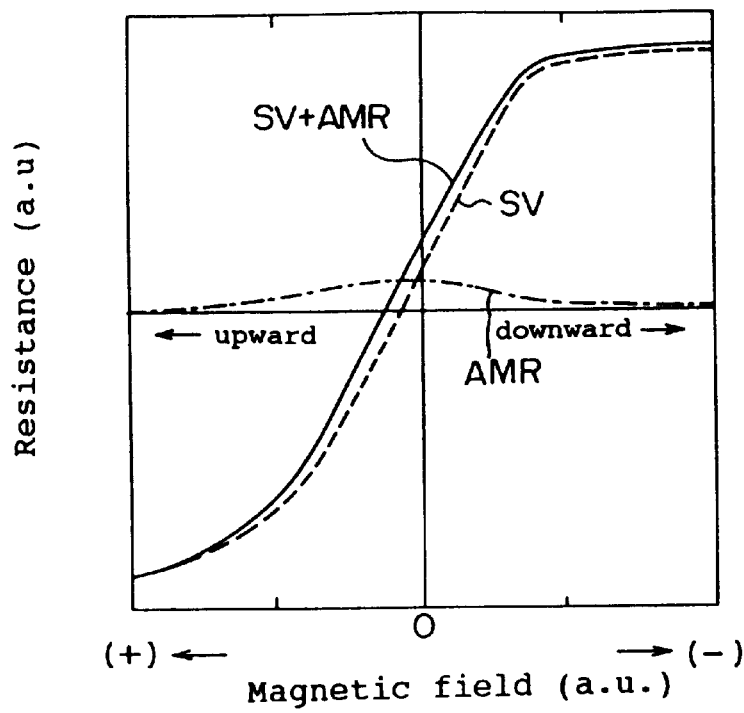
FIG. 17 is a characteristic diagram showing the pattern of the change in electric resistivity of the SVMR head according to the ninth embodiment of this invention.

Next, the SVMR head constructed as illustrated in FIG. 15A was tested for variation of resistance relative to an externally applied magnetic field. The results are shown in FIG. 17. It is noted from FIG. 17 that the AMR effect brought about an extremely small variation in the magnitude of resistance.

By the use of an inductive magnetic head, magnetic data were written in the first bit of a magnetic recording medium 50 of the shape of a disc so as to generate a magnetic field in the upward direction and magnetic data were written in the second bit thereof so as to generate a magnetic field in the downward direction. The magnetic data consequently written in the magnetic recording medium 50 were reproduced by the use of an SVMR head shown in FIG. 15A.

Figure 18:
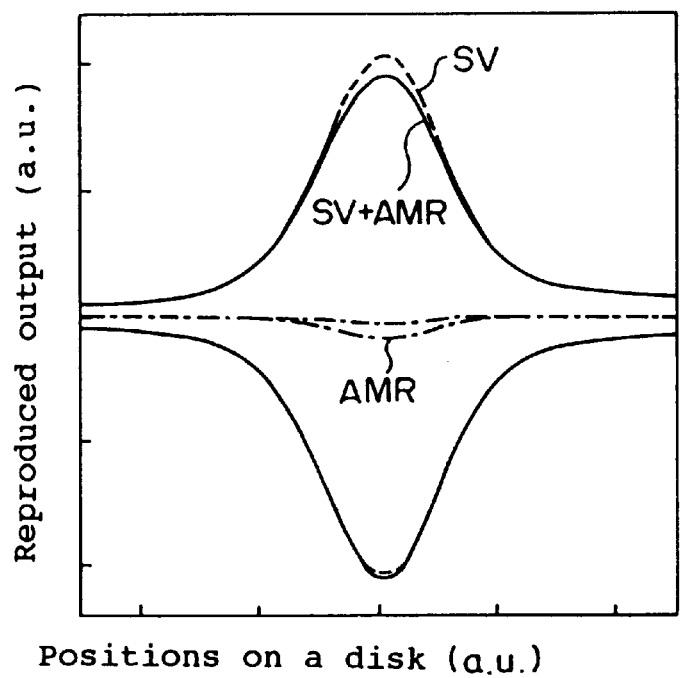
FIG. 18 is a characteristic diagram showing a dependance of the reproduced output upon the reproducing position on the magnetic recording medium in the SVMR head according to the ninth embodiment of this invention.

In the reproduced output waveform of the magnetic data in the first bit, the first reproduced output by the variation of resistance to which the SVMR effect and the AMR effect had been imparted assumed such a shape of groove as is indicated by a continuous line in FIG. 18. Then, in the reproduced output waveform of the magnetic data in the second bit, the second reproduced output by the variation of resistance to which the SVMR effect and the AMR effect had been imparted assumed such a shape of ridge as is indicated by a continuous line in FIG. 18.

Since the component of variation in the reproduced output caused by the AMR effect was small, the waveform of the first reproduced output and that of the second reproduced output were substantially symmetric about the prescribed magnitude of reproduced output and the asymmetry assumed a smaller coefficient, −4.6%, than the conventional one.

The SVMR head of a structure such that the component layers of the magnetic layer forming the magnetic head are superposed in a reverse order from that shown in FIG. 15A and the direction of magnetization $M_2$ of the pinning magnetic layer and the axis of easy magnetization $M_1$ of the free magnetic layers are differentiated from those shown in FIG. 15B will be described below with reference to FIG. 19A and FIG. 19B.

Figure 19A:
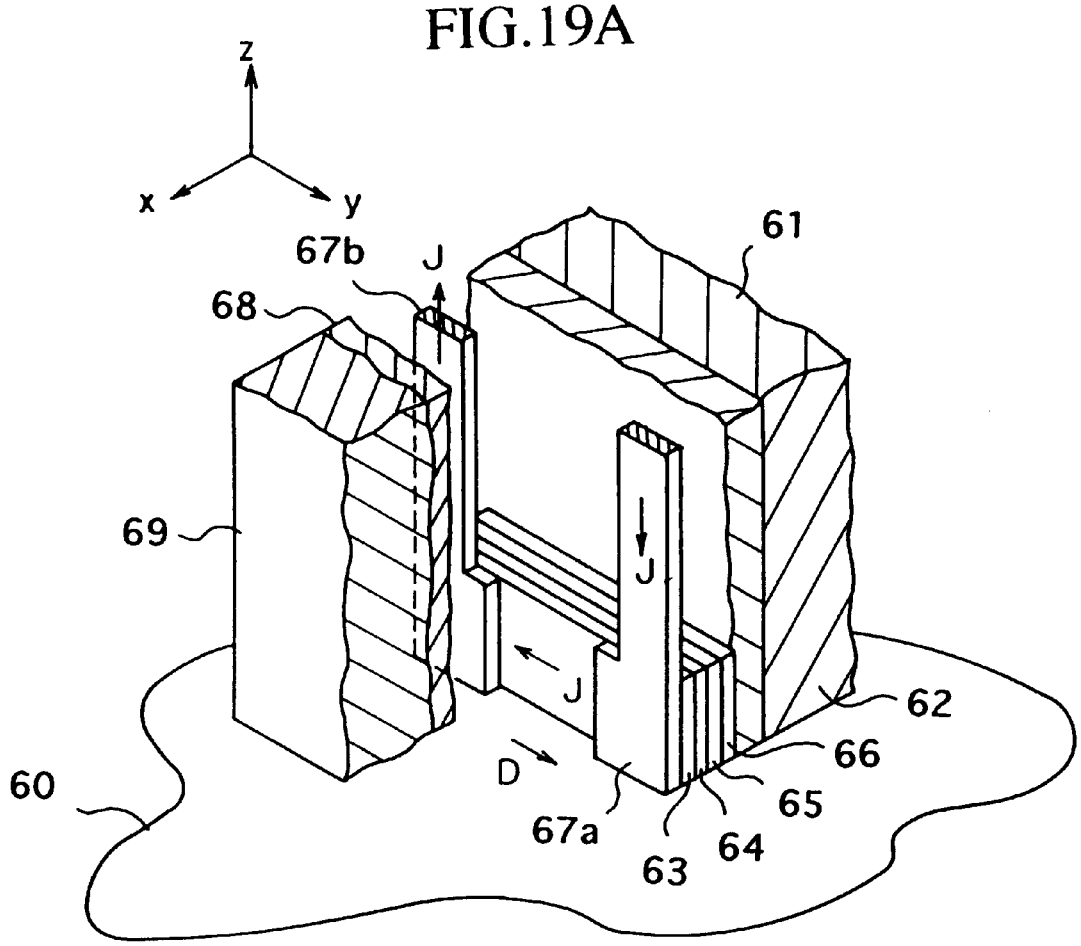
FIG. 19A is a perspective view showing the essential part of another SVMR head in X, Y and Z directions according to the ninth embodiment of this invention.

In FIG. 19A, a first nonmagnetic insulating layer 62 made of $Al_2O_3$ is formed on a first magnetic shield layer 61 made of NiFe. Then, an antiferromagnetic layer 66 made of NiO, a pinning magnetic layer 65 made of $(CO_{90}Fe_{10})_{90}B_{10}$, a nonmagnetic intermediate layer 64 made of Cu, and a free magnetic layer 63 are formed on the first nonmagnetic insulating layer 62.

The free magnetic layer 63 has a two-layer structure consisting of an NiFe layer and a $(CO_{90}Fe_{10})_{90}B_{10}$ layer.

The component layers from the antiferromagnetic layer 66 through the free magnetic layer 63 are electrically joined and are patterned jointly in a rectangular shape on the first nonmagnetic insulating layer 62. A pair of leads 67a and 67b which are made of gold are formed in the opposite ends of the antiferromagnetic layer 66.

The free magnetic layer 63, the leads 67a and 67b, etc. on the first nonmagnetic insulating layer 62 are covered with a second nonmagnetic insulating layer 68 made of $Al_2O_3$. A second magnetic shield layer 69 made of NiFe is formed on the second nonmagnetic insulating layer 68.

The free magnetic layer 63 has a thickness of 7.5 nm, the nonmagnetic intermediate layer 64 a thickness of 3 nm, the pinning magnetic layer 65 a thickness of 3 nm, and the antiferromagnetic layer 66 a thickness of 10 nm.

Figure 19B:
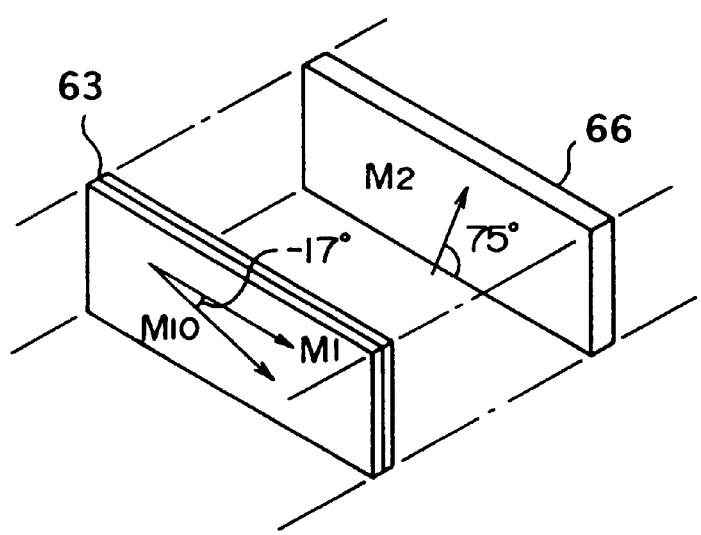
FIG. 19B is a perspective view showing a relationship between the direction of the magnetization of the free magnetic layer and that of the pinning magnetic layer in FIG. 19A.

In the SVMR head constructed as described above, the axis of easy magnetization $M_1$ of the free magnetic layer 63 is parallel to the direction of width D of a track core as shown in FIG. 19B. The direction of magnetization Mio of the free magnetic layer 63 tilts with an angle of −17° from the axis of easy magnetization M1 by passing a sense current J in the area intervening between the two leads 67a and 67b. The direction of the magnetization $M_2$ of the pinning magnetic layer 65 is caused to form an angle of +75° relative to the direction of width D of the track core by the exchange coupling force generated with the antiferromagnetic layer 66.

Figure 20:
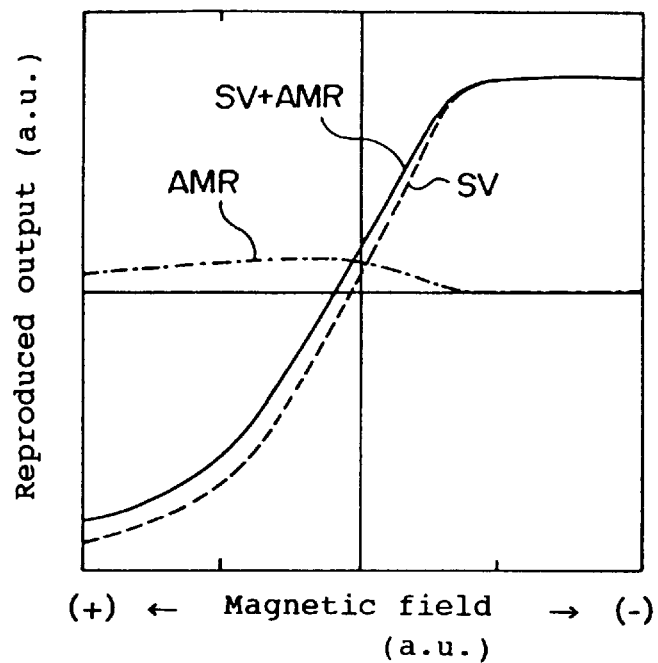
FIG. 20 is a characteristic diagram showing the pattern of the change in the electric resistance relative to the externally applied magnetic field in the SVMR head according to the ninth embodiment of this invention.

Then, the SVMR head was tested for variation of the magnitude of resistance caused by an externally applied magnetic field. The results are shown in FIG. 20. It is noted from FIG. 20 that the AMR effect brought about an extremely small variation in the magnitude of resistance.

Next, the SVMR head constructed as illustrated in FIG. 19A was tested for variation of resistance relative to an externally applied magnetic field. The results are shown in FIG. 20. It is noted from FIG. 20 that the AMR effect brought about an extremely small variation in the magnitude of resistance.

By the use of an inductive magnetic head, magnetic data were written in the first bit of a magnetic recording medium 60 of the shape of a disc so as to generate a magnetic field in the upward direction and magnetic data were written in the second bit thereof so as to generate a magnetic field in the downward direction. The magnetic data consequently written in the magnetic recording medium 60 were reproduced by the use of an SVMR head shown in FIG. 18.

Figure 21:
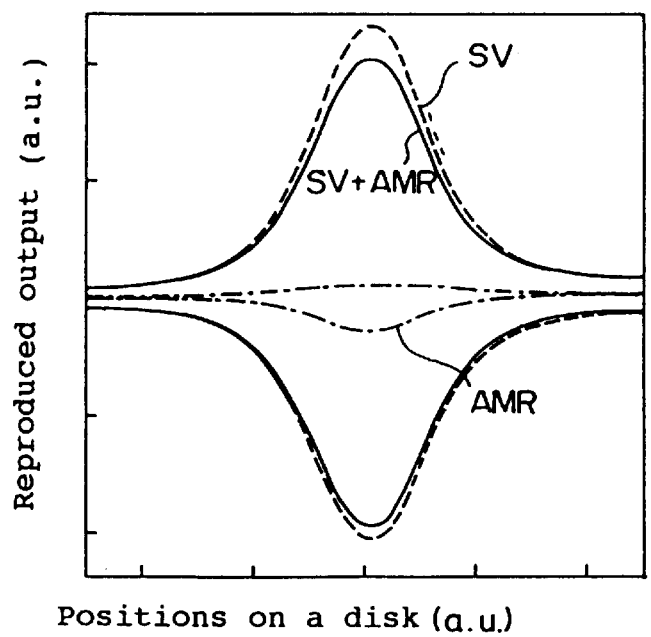
FIG. 21 is a characteristic diagram showing a dependance of the reproduced output upon the reproducing position on the magnetic recording medium in another SVMR head according to the ninth embodiment of this invention.

In the reproduced output waveform of the magnetic data in the first bit, the first reproduced output by the variation of resistance to which the SVMR effect and the AMR effect had been imparted assumed such a shape of groove as is indicated by a continuous line in FIG. 21. Then, in the reproduced output waveform of the magnetic data in the second bit, the second reproduced output by the variation of resistance to which the SVMR effect and the AMR effect had been imparted assumed such a shape of ridge as is indicated by a continuous line in FIG. 21.

Since the component of variation in the reproduced output caused by the AMR effect was small, the waveform of the first reproduced output and that of the second reproduced output were substantially symmetric about the prescribed magnitude of reproduced output and the asymmetry assumed a smaller coefficient, −4.6%, than the conventional one.

(3) Tenth Embodiment

Now, a magnetic recording/reproducing drive according to the tenth embodiment and using the magnetoresistive (MR) transducer according to any of the first to ninth embodiments cited above will be described below with reference to FIG. 22 and FIG. 23A to FIG. 23C.

Figure 22:
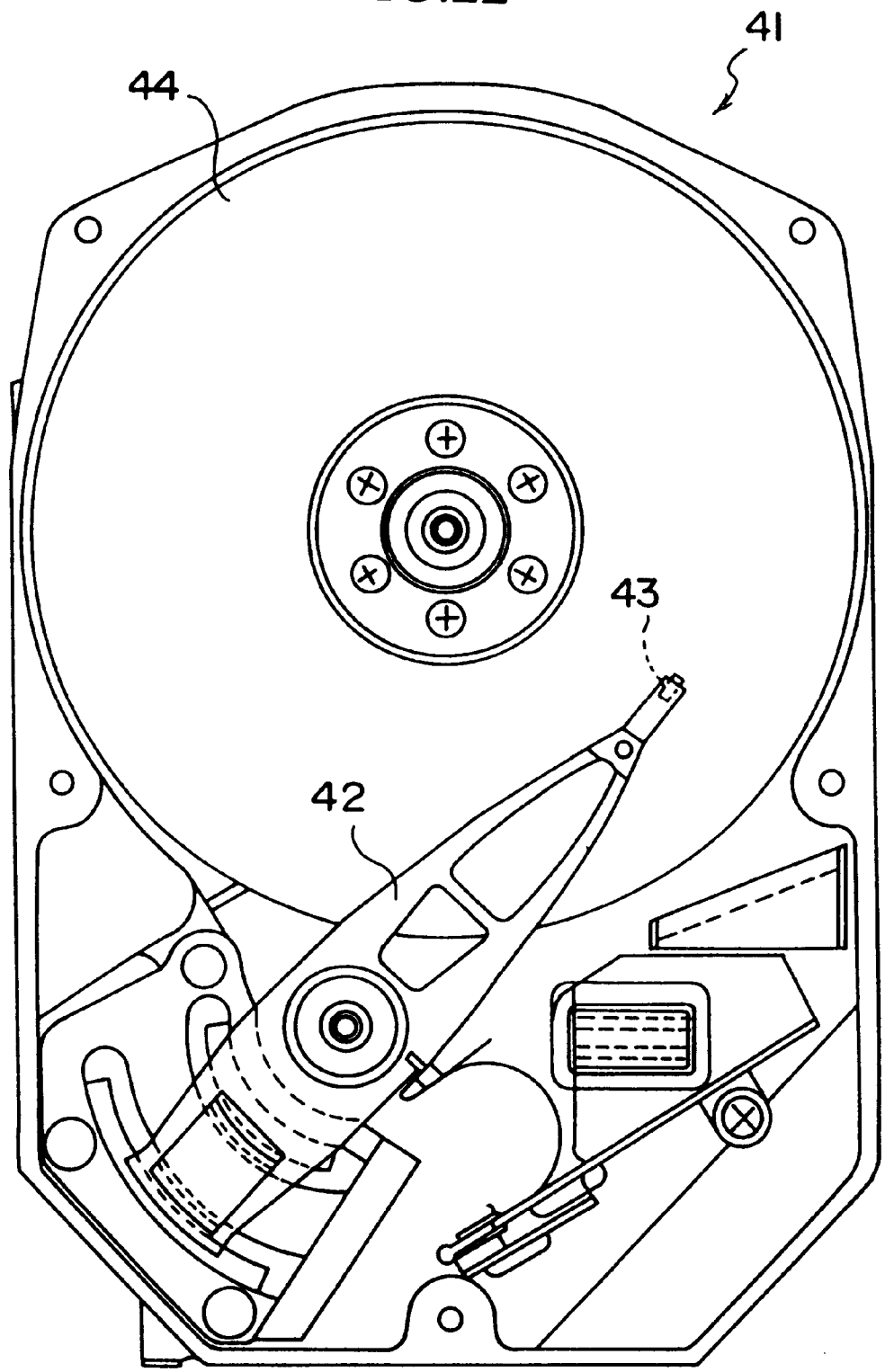
FIG. 22 is a plan view illustrating a magnetic recording/reproducing drive according to the tenth embodiment of this invention.
Figure 23A:
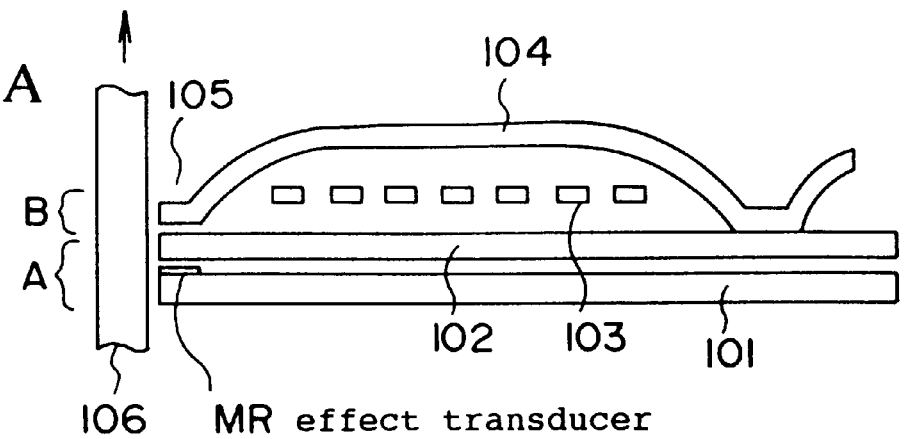
FIG. 23A is a cross section illustrating the MR head of the in-gap type in the magnetic recording/reproducing drive according to the tenth embodiment of this invention.
Figure 23B:
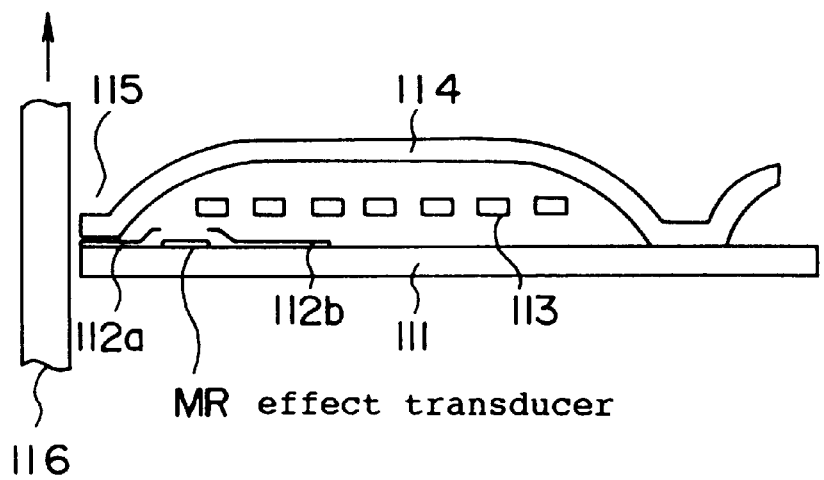
FIG. 23B is a cross section illustrating the MR head of the common-use type in the magnetic recording/reproducing drive according to the tenth embodiment of this invention.
Figure 23C:
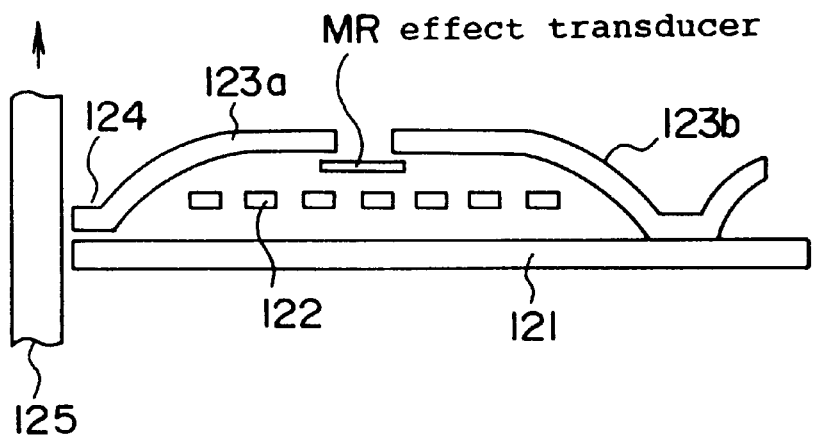
FIG. 23C is a cross section illustrating the MR head of the yoke type in the magnetic recording/reproducing drive according to the tenth embodiment of this invention.

FIG. 22 is a plan view illustrating the whole structure of the magnetic recording/reproducing drive and FIG. 23A to FIG. 23C are cross sections illustrating the parts, a magnetic recording medium and a magnetic head, of the magnetic recording/reproducing drive.

The magnetic recording/reproducing drive 41, as illustrated in FIG. 22, comprises a slider 43 provided with an MR head, a magnetic disc (magnetic recording medium) 44, and a spring arm 42 serving to direct the slider 43. The MR effect transducer according to any of the first through seventh embodiments is attached to the MR head.

FIG. 23A illustrates a composite MR head. Part A represents a reproducing head and Part B a recording head. A soft magnetic layer 102 serves concurrently as a magnetic shield for the reproducing head and a magnetic pole for the recording head.

In the part of the reproducing head, soft magnetic layers 101 and 102 intended as magnetic shields are opposed to each other across a gap and the MR effect transducer mentioned above is nipped in the gap between a magnetic recording medium 106 and a part opposed thereto as illustrated in FIG. 23A. The leak magnetic field from the magnetic recording medium 106 is directly detected by the MR effect transducer.

In the part of the recording head, soft magnetic layers 102 and 104 intended as magnetic poles are opposed to each other across a gap and a coil 103 for generating a magnetic flux to be passed through the soft magnetic layers 102 and 104 is formed in the gap intervening between the soft magnetic layers 102 and 104. This magnetic flux causes a leak magnetic field to be generated from the gap of the opposed part 105 and recorded by the magnetic recording medium 106.

FIG. 23B illustrates an in-gap type MR head provided with a flux guide. As illustrated in this diagram, soft magnetic layers 111 and 114 serving as magnetic poles are opposed to each other across a gap, the MR effect transducer mentioned above is nipped in the gap between a magnetic recording medium 116 and a part 115 opposed thereto, and a coil 113 for generating a magnetic flux to be passed through the soft magnetic layers 111 and 114 is formed in the gap between the soft magnetic layers 111 and 114.

The MR effect transducer is not exposed to the part 115 opposed to the magnetic recording medium 116 but recessed from the magnetic head so as to avoid corrosion or avoid direct contact with the magnetic recording medium. A flux guide 112a which is electrically insulated from and magnetically connected to the MR effect transducer is exposed to the opposed part 115. The leak magnetic field from the magnetic recording medium 116 is introduced into the flux guide 112a and detected by the MR effect transducer. At the other terminal of the MR effect transducer, another flux guide 112b electrically insulated from and magnetically connected to the MR effect transducer is formed. The flux guide 112b serves the purpose of guiding the magnetic flux which has passed through the MR effect transducer to the soft magnetic layers 111 and 114.

FIG. 23C illustrates a yoke type MR head. As illustrated in the diagram, soft magnetic layers 121, 123a, and 123b intended as magnetic poles are opposed to each other across a gap and a coil 122 for generating a magnetic flux to be passed through the soft magnetic layer 121 and the soft magnetic layers 123a and 123b is formed in the gap between the soft magnetic layer 121 and the soft magnetic layers 123a and 123b. The MR effect transducer is disposed at a portion severing the soft magnetic layers 123a and 123b as electrically insulated from and magnetically connected to each other. The magnetic flux generated in the coil 122 and passed through the soft magnetic layer 121 and the soft magnetic layers 123a and 123b causes a leak magnetic field to be generated from the gap of the opposed part 124 and recorded in the magnetic recording medium 125.

The magnetic recording/reproducing drive illustrated in FIG. 22 and FIG. 23A to FIG. 23C, owing to the use of the MR effect transducer according to the embodiment just cited, is enabled to acquire high heat resistance, preclude the degradation of the magnetoresistive characteristic, and manifest improved reliability of performance.

FIG. 23A to FIG. 23C invariably omit illustrating such components as a substrate on which the MR head is formed and an insulating film interposed between soft magnetic layers. The MR effect transducer according to the present embodiment of this invention does not need to be limited to the magnetic recording/reproducing drive described above but may be applied for various magnetic recording/reproducing drives which are possessed of a writing part and a reading part.

It is also allowable to apply the MR effect transducer described above for such magnetic recording/reproducing drives as are used exclusively for reproduction.

The free magnetic layer and the pinning magnetic layer which are superposed through the medium of the nonmagnetic metal layer as described above each has a cobalt-iron type alloy layer (containing boron or carbon) formed on the side thereof for contact with the nonmagnetic metal layer.

Owing to the inclusion of boron or carbon, the cobalt-iron type alloy layers are allowed to have the d spacings thereof lowered below the d spacing of a cobalt-iron alloy.

Further, the cobalt-iron type alloy layers, particularly the cobalt-iron type alloy layers on the free magnetic layer side, enjoy good crystallinity and acquire a face-centered cubic lattice structure because they are superposed through the medium of the ground layer and the free magnetic layer or the ground layer and the nonmagnetic metal layer, for example.

Thus, based on the results of experiments, the cobalt-iron type metal layers are enabled to acquire improved barrier property against copper and the magnetoresistive transducer and the magnetic recording/reproducing drive to acquire enhanced heat resistance.

What is claimed is:

1. A magnetoresistive transducer comprising:
 a multilayer having at least a soft magnetic layer and a conductive nonmagnetic layer alternately laminated therein, wherein said soft magnetic layer is a multilayer superposed structure including a $(Co_yFe_{100-y})_{100-x}Z_x$ alloy layer, wherein Z represents boron, and x and y represent atomic fractions (at %), and an alloy layer containing at least Ni and Fe, said $(Co_yFe_{100-y})_{100-x}Z_x$ alloy layer of said soft magnetic layer bordering on said nonmagnetic layer and having a face-centered cubic lattice structure with a d spacing smaller than a d spacing of a $Co_yFe_{100-y}$ alloy; and
 a pair of electrodes formed on said multilayer for allowing a sense current to pass through said multilayer.

2. The magnetoresistive transducer according to claim 1, wherein said nonmagnetic layer is formed of a copper film.

3. The magnetoresistive transducer according to claim 1, wherein said $(Co_yFe_{100-y})_{100-x}Z_x$ alloy layer has a boron content of less than 10 at %.

4. The magnetoresistive transducer according to claim 1, wherein the atomic fraction, y, of cobalt in said $(Co_yFe_{100-y})_{100-x}Z_x$ alloy layer is in the range of 85 to 95 at %.

5. The magnetoresistive transducer according to claim 1, wherein said $(Co_yFe_{100-y})_{100-x}Z_x$ alloy layer has a thickness of not less than 3 nm.

6. The magnetoresistive transducer according to claim 1, which further comprises antiferromagnetic layers formed in opposite terminal parts of said nonmagnetic layer below said electrodes.

7. The magnetoresistive transducer according to claim 6, wherein said antiferromagnetic layers are each formed of at least one member selected from the group consisting of FeMn film, NiMn film, PtMn film, PdMn film, PdPtMn film, CrMn film, and IrMn film.

8. A magnetoresistive transducer comprising:
 a multilayer provided with a first soft magnetic layer, a conductive nonmagnetic layer, a second soft magnetic layer, and a biasing magnetic layer giving a magnetization of a predetermined direction to said second soft magnetic layer, in that order of superposition, wherein said first soft magnetic layer is a multilayer superposed structure including a $(Co_yFe_{100-y})_{100-x}Z_x$ alloy layer wherein Z represents boron and x and y represent atomic fractions (at %), and an alloy layer containing at least Ni and Fe, said $(Co_yFe_{100-y})_{100-x}Z_x$ alloy layer of said first soft magnetic layer bordering on said nonmagnetic layer and having a face-centered cubic lattice structure with a d spacing smaller than a d spacing of a $Co_yFe_{100-y}$ alloy; and
 a pair of electrodes formed on said multilayer for allowing a sense current to pass through said multilayer.

9. The magnetoresistive transducer according to claim 8, wherein said nonmagnetic layer is formed of a copper film.

10. The magnetoresistive transducer according to claim 8, wherein said $(Co_yFe_{100-y})_{100-x}Z_x$ alloy layer has a boron content of less than 10 at %.

11. The magnetoresistive transducer according to claim 8 wherein said biasing magnetic layer is one of an antiferromagnetic layer and a hard magnetic layer.

12. The magnetoresistive transducer according to claim 11, wherein said biasing magnetic layer is formed of at least one member selected from the group consisting of FeMn film, NiO film, $\alpha$-$Fe_2O_3$ film, NiMn film, PtMn film, PdMn film, PdPtMn film, CrMn film, and IrMn film.

13. The magnetoresistive transducer according to claim 11, wherein said baising magnetic layer comprises of one of an NiO film and an $\alpha$-$Fe_2O_3$ film and said multilayer, in which said antiferromagnetic layer is provided,is formed on an attic substrate either directly or through the medium of an alumina film, so that said antiferromagnetic layer contacts said altic substrate or said alumina film.

14. The magnetoresistive transducer according to claim 11, wherein said multilayer, in which said baising magnetic layer comprises one of an NiO film and an $\alpha$-$Fe_2O_3$ film, is formed on an altic substrate either directly or through the medium of an alumina film, so that said first magnetic layer contacts said altic substrate or said alumina film and said baising magnetic layer on said second magnetic layer is put between said pair of electrodes which directly contact said second magnetic layer.

15. The magnetoresistive transducer according to claim 8, wherein said second soft magnetic layer is in a one-layer structure comprising of a $(Co_yFe_{100-y})_{100-x}Z_x$ alloy layer.

16. The magnetoresistive transducer according to claim 8, wherein said second soft magnetic layer is in a multi-layer superposed structure comprising of a $(Co_yFe_{100-y})_{100-x}Z_x$ alloy layer bordering on said nonmagnetic layer and an alloy layer containing at least Ni and Fe.

17. The magnetoresistive transducer according to claim 8, claim 4, or claim 5, wherein the atomic fraction, y, of cobalt in said $(Co_yFe_{100-y})_{100-x}Z_x$ alloy layer is in the range of 85 to 95 at %.

18. The magnetoresistive transducer according to claim 8, claim 4, or claim 5, wherein said $(Co_yFe_{100-y})_{100-x}Z_x$ alloy layer has a thickness of not less than 3 nm.

19. The magnetoresistive transducer according to claim 15 wherein said z said $(Co_yFe_{100-y})_{100-x}Z_x$ alloy layer of said second soft magnetic layer represents an atom of one of boron and carbon.

20. The magnetoresistive transducer according to claim 16 wherein said Z of said $(Co_yFe_{100-y})_{100-x}Z_x$ alloy layer of said second soft magnetic layer represents an atom of one of boron and carbon.

21. The magnetoresistive transducer according to claim 19 wherein said $(Co_yFe_{100-y})_{100-x}Z_x$ alloy layer of said second soft magnetic layer has a content of said boron of less than 10 at %.

22. The magnetores is five transducer according to claim 20 wherein said $(Co_yFe_{100-y})_{100-x}Z_x$ alloy layer of said second soft magnetic layer has a content of said boron of less than 10 at%.

23. A magnetic recording/reproducing drive, provided with:
(a) a magnetic recording medium; and
(b) a magnetoresistive transducer comprising,
(1) a multilayer provided with a first soft magnetic layer, a conductive nonmagnetic layer, a second soft magnetic layer, and a biasing magnetic layer giving a magnetization of a predetermined direction to said second soft magnetic layer, in that order of superposition, said first soft magnetic layer being a multilayer superposed structure including a $(Co_yFe_{100-y})_{100-x}Z_x$ alloy layer wherein Z represents boron and x and y represent atomic fractions (at %), and an alloy layer containing at least Ni and Fe, said $(Co_yFe_{100-y})_{100-x}Z_x$ alloy layer of said first soft magnetic layer bordering on said nonmagnetic layer and having a face-centered cubic lattice structure with a d spacing smaller than a d spacing of a $Co_yFe_{100-y}$ alloy, and
(2) a pair of electrodes formed on said multilayer for allowing a sense current to pass through said multilayer.

24. A magnetic recording/reproducing drive provided with:
(a) a magnetic recording medium; and
(b) a magnetoresistive transducer comprising,
(1) a multilayer having at least a soft magnetic layer and a conductive nonmagnetic layer alternately laminated therein, wherein said soft magnetic layer is a multilayer superposed structure including a $(Co_yFe_{100-y})_{100-x}Z_x$ alloy layer, wherein Z represents boron and x and y represent atomic fractions (at %), and an alloy layer containing at least Ni and Fe, said $(Co_yFe_{100-y})_{100-x}Z_x$ alloy layer of said soft magnetic layer bordering on said nonmagnetic layer and having a face-centered cubic lattice structure with a d spacing smaller than a d spacing of a $(Co_yFe_{100-y})$ alloy, and
(2) a pair of electrodes formed on said multilayer for allowing a sense current to pass through said multilayer.

25. A magnetoresistive transducer, comprising:
a multilayer having at least a soft magnetic layer and a conductive nonmagnetic layer alternately laminated therein, wherein said soft magnetic layer is provided with at least a $(Co_yFe_{100-y})_{100-x}C_x$ alloy layer containing Co wherein x and y represent atomic fractions (at %), said $(Co_yFe_{100-y})_{100-x}C_x$ alloy layer of said soft magnetic layer bordering on said nonmagnetic layer and having a face-centered cubic lattice structure with a d spacing smaller than a d spacing of a $(Co_yFe_{100-y})$ alloy; and
a pair of electrodes formed on said multilayer for allowing a sense current to pass through said multilayer.

26. A magnetoresistive transducer comprising:
a multilayer provided with a first soft magnetic layer, a conductive nonmagnetic layer, a second soft magnetic layer, and a biasing magnetic layer giving a magnetization of a predetermined direction to said second soft magnetic layer, in that order of superposition,wherein said first soft magnetic layer is provided with at least a $(Co_yFe_{100-y})_{100-x}C_x$ alloy layer containing Co wherein x and y represent atomic fractions (at %), said $(Co_yFe_{100-y})_{100-x}C_x$ alloy layer of said first magnetic layer bordering on said nonmagnetic layer and having a face-centered cubic lattice structure with a d spacing smaller than a d spacing of a $(Co_yFe_{100-y})$ alloy; and
a pair of electrodes formed on said multilayer for allowing a sense current to pass through said multilayer.

27. A magnetic recording/reproducing drive, provided with:
(a) a magnetic recording medium; and
(b) a magnetoresistive transducer comprising,
(1) a multilayer provided with a first soft magnetic layer, a conductive nonmagnetic layer, a second soft magnetic layer, and a biasing magnetic layer giving a magnetization of a predetermined direction to said second soft magnetic layer, in that order of superposition, said first soft magnetic layer being provided with at least a $(Co_yFe_{100-y})_{100-x}C_x$ alloy layer containing Co wherein x and y represent atomic fractions (at %), said $(Co_yFe_{100-y})_{100-x}C_x$ alloy layer of said first soft magnetic layer bordering on said nonmagnetic layer and having a face-centered cubic lattice structure with a d spacing smaller than a d spacing of a $(Co_yFe_{100-y})$ alloy, and (2) a pair of electrodes formed on said multilayer for allowing a sense current to pass through said multilayer.

28. A magnetic recording/reproducing drive, provided with:

(a) a magnetic recording medium; and (b) a magnetoresistive transducer comprising, (1) a multilayer having at least a soft magnetic layer and a conductive nonmagnetic layer alternately laminated therein, wherein said soft magnetic layer is provided with at least a $(Co_yFe_{100-y})_{100-x}C_x$ alloy layer containing Co wherein x and y represent atomic fractions (at % ), said $(Co_yFe_{100-y})_{100-x}C_x$ alloy layer of said first soft magnetic layer bordering on said nonmagnetic layer and having a face-centered cubic lattice structure with a d spacing smaller than a d spacing of a $(Co_yFe_{100-y})$, and (2) a pair of electrodes formed on said multilayer for allowing a sense current to pass through said multilayer.

* * * * *

UNITED STATES PATENT AND TRADEMARK OFFICE
CERTIFICATE OF CORRECTION

PATENT NO.   : 6,154,349
DATED        : November 28, 2000
INVENTOR(S)  : Kanai et al.

It is certified that error appears in the above-identified patent and that said Letters Patent is hereby corrected as shown below:

Title page,
ABSTRACT,
Line 10, please delete "ofthe" and insert -- of the --.

Column 21,
Line 10, please delete "baising" and insert -- biasing --.
Line 10, please delete "comprises of" and insert -- comprises --.
Line 12, please delete "antiferromagnetic" and insert -- biasing magnetic --.
Line 12, please delete "provided,is" and insert -- provided, is --.
Line 13, please delete "medium of an".
Line 14, please delete "antiferromagnetic" and insert -- biasing magnetic --.
Line 17, please delete "baising" and insert -- biasing --.
Line 20, please delete "medium of an".
Line 22, please delete "baising" and insert -- biasing --.
Line 27, please delete "Z" and insert -- Z' --.
Line 30, please delete "Z" and insert -- Z' --.
Line 40, please delete "z" and insert -- Z' --.
Line 40, please delete "Z" (second instance) and insert -- Z' --.
Line 44, please delete both instances of "Z" and insert -- Z' --.
Line 49, please delete "$Z_x$" and insert -- $Z'_x$ --.
Line 53, please delete "Z" and insert -- Z' --.

Signed and Sealed this

Twelfth Day of March, 2002

*Attest:*

*Attesting Officer*

JAMES E. ROGAN
*Director of the United States Patent and Trademark Office*